(12) United States Patent
Takabe et al.

(10) Patent No.: US 11,752,766 B2
(45) Date of Patent: Sep. 12, 2023

(54) LIQUID DISCHARGING HEAD, LIQUID DISCHARGING APPARATUS, AND METHOD OF MANUFACTURING LIQUID DISCHARGING HEAD

(71) Applicant: SEIKO EPSON CORPORATION, Tokyo (JP)

(72) Inventors: Motoki Takabe, Shiojiri (JP); Noritaka Mochizuki, Kofu (JP); Yoshihiro Hokari, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 17/192,490

(22) Filed: Mar. 4, 2021

(65) Prior Publication Data
US 2021/0276330 A1 Sep. 9, 2021

(30) Foreign Application Priority Data
Mar. 6, 2020 (JP) .................................. 2020-038524

(51) Int. Cl.
| | | |
|---|---|---|
| *B41J 2/14* | (2006.01) | |
| *B41J 2/16* | (2006.01) | |
| *H10N 30/87* | (2023.01) | |
| *H10N 30/20* | (2023.01) | |
| *H10N 30/853* | (2023.01) | |

(52) U.S. Cl.
CPC .......... *B41J 2/14233* (2013.01); *B41J 2/161* (2013.01); *B41J 2/164* (2013.01); *H10N 30/877* (2023.02); *H10N 30/2047* (2023.02); *H10N 30/8554* (2023.02)

(58) Field of Classification Search
None
See application file for complete search history.

(56) References Cited

U.S. PATENT DOCUMENTS

| | | | | |
|---|---|---|---|---|
| 2007/0046736 A1* | 3/2007 | Katayama | ............ | B41J 2/14233 347/68 |
| 2009/0053402 A1* | 2/2009 | Sekiguchi | ............ | B41J 2/14233 427/100 |
| 2010/0123761 A1* | 5/2010 | Saito | ...................... | B41J 2/1646 204/192.15 |
| 2012/0167823 A1* | 7/2012 | Gardner | .............. | H01L 41/0805 29/25.35 |

(Continued)

FOREIGN PATENT DOCUMENTS

| | | |
|---|---|---|
| JP | H01-067939 | 3/1989 |
| JP | H11-087333 | 3/1990 |
| JP | 2016-058467 | 4/2016 |

*Primary Examiner* — Erica S Lin
(74) *Attorney, Agent, or Firm* — WORKMAN NYDEGGER

(57) ABSTRACT

A liquid discharging head includes a pressure chamber partitioning portion that includes a plurality of partitioning walls that partition a pressure chamber in which a pressure to discharge a liquid is applied to the liquid, a diaphragm that includes a wall surface that faces the pressure chamber, The pressure chamber is located between the partitioning walls in a second direction. The wall surface of the diaphragm includes a first portion at a first position, and a second portion. A position of the second portion in the first direction is on an opposite side in the first direction with respect to a position of the first portion in the first direction.

13 Claims, 17 Drawing Sheets

(56) References Cited

U.S. PATENT DOCUMENTS

| | | | |
|---|---|---|---|
| 2012/0262029 A1* | 10/2012 | De Brabander | H01L 41/053 |
| | | | 257/E29.022 |
| 2013/0258000 A1* | 10/2013 | Ohashi | B41J 2/1631 |
| | | | 310/311 |
| 2015/0266295 A1* | 9/2015 | Miyazaki | B41J 2/1646 |
| | | | 347/71 |
| 2016/0067967 A1 | 3/2016 | Naganuma et al. | |

\* cited by examiner

LIQUID DISCHARGING HEAD, LIQUID DISCHARGING APPARATUS, AND METHOD OF MANUFACTURING LIQUID DISCHARGING HEAD

The present application is based on, and claims priority from JP Application Serial Number 2020-038524, filed Mar. 6, 2020, the disclosure of which is hereby incorporated by reference herein in its entirety.

BACKGROUND

1. Technical Field

The present disclosure relates to a liquid discharging head including a pressure chamber, a liquid discharging apparatus, and a method of manufacturing the liquid discharging head.

2. Related Art

As a liquid discharging head, a piezoelectric liquid discharging head that discharges a droplet through a nozzle by bending and deforming a diaphragm, which constitutes a portion of a wall of a pressure chamber, with a piezoelectric element is known. In order to reliably suppress cracking from occurring in a piezoelectric layer, a liquid ejecting head disclosed in JP-A-2016-58467 includes an upper electrode layer provided so as to extend to a region in which bending and deformation of the piezoelectric layer is impeded, a common metal layer provided so as to extend to a position overlapping the region described above, and a common adhesion layer provided so as to exceed the position overlapping the common metal layer to extend to an end portion of the upper electrode layer. A pressure chamber forming substrate of the liquid discharging head includes a plurality of partition walls that partition the pressure chambers. When no drive voltage is applied to the piezoelectric element, the wall surface in the diaphragm at a portion facing the pressure chamber is a flat surface.

In the diaphragm, a pressure chamber corresponding portion that faces the pressure chamber is repeatedly bent and deformed, and bending and deformation is impeded in a pressure chamber non-corresponding portion that overlaps the partition wall. In particular, when the drive pulse fed to the piezoelectric element becomes high in frequency, the bending and deformation in the pressure chamber corresponding portion of the diaphragm becomes high in frequency. Accordingly, in the liquid ejecting head described above, the region in the pressure chamber corresponding portion of the diaphragm, which is near the pressure chamber non-corresponding portion, is in a state allowing cracking to occur easily.

Note that the issue described above also exists in various liquid discharging heads and liquid discharging apparatuses other than the liquid ejecting head described above.

SUMMARY

A liquid discharging head of the present disclosure, in one aspect, includes a pressure chamber partitioning portion that includes a plurality of partitioning walls that partition a pressure chamber in which a pressure to discharge a liquid is applied to the liquid, a diaphragm that includes a wall surface that faces the pressure chamber, and a piezoelectric substance, the pressure chamber partitioning portion, the diaphragm, and the piezoelectric substance being provided in order in a first direction. The plurality of partitioning walls include a first partitioning wall and a second partitioning wall, the pressure chamber is located between the first partitioning wall and the second partitioning wall in a second direction that intersects the first direction, and the wall surface of the diaphragm includes a first portion at a first position, in which a distance between the first position and the first partitioning wall in the second direction is equivalent to or smaller than a distance between the first position and the second partitioning wall in the second direction, and a second portion at a second position between the first position and the first partitioning wall in the second direction, and a position of the second portion in the first direction is on an opposite side in the first direction with respect to a position of the first portion in the first direction.

Furthermore, a liquid discharging head of the present disclosure, in one aspect, includes the liquid discharging head described above, and a control portion that controls an operation of discharging the liquid from the liquid discharging head.

Furthermore, a method of manufacturing a liquid discharging head according to the present disclosure including a pressure chamber partitioning portion that includes a plurality of partitioning walls that partition a pressure chamber in which a pressure to discharge a liquid is applied to the liquid, a diaphragm that includes a wall surface that faces the pressure chamber, and a piezoelectric substance, the pressure chamber partitioning portion, the diaphragm, and the piezoelectric substance being provided in order in a first direction, in which the plurality of partitioning walls include a first partitioning wall and a second partitioning wall, the pressure chamber is located between the first partitioning wall and the second partitioning wall in a second direction that intersects the first direction, and the wall surface of the diaphragm includes a first portion at a first position, in which a distance between the first position and the first partitioning wall in the second direction is equivalent to or smaller than a distance between the first position and the second partitioning wall in the second direction, and a second portion at a second position between the first position and the first partitioning wall in the second direction, the method of manufacturing, in one aspect, includes an oxide film forming step that forms an oxide film on a surface of the substrate, in which the pressure chamber is formed, so that the oxide film, in the second direction, exists at the first position and does not exist at a position corresponding to the first partitioning wall, a thermal oxidation step that forms a thermal oxide layer, the thermal oxide layer being included in the diaphragm, by performing thermal oxidation on the surface of the substrate on which the oxide film is formed so that a position of the second portion in the first direction is positioned on an opposite side in the first direction with respect to a position of the first portion in the first direction, and a pressure chamber forming step that forms a pressure chamber while leaving behind the thermal oxide layer on the substrate on which the thermal oxide layer is formed.

DESCRIPTION OF EXEMPLARY EMBODIMENTS

Figure 1:
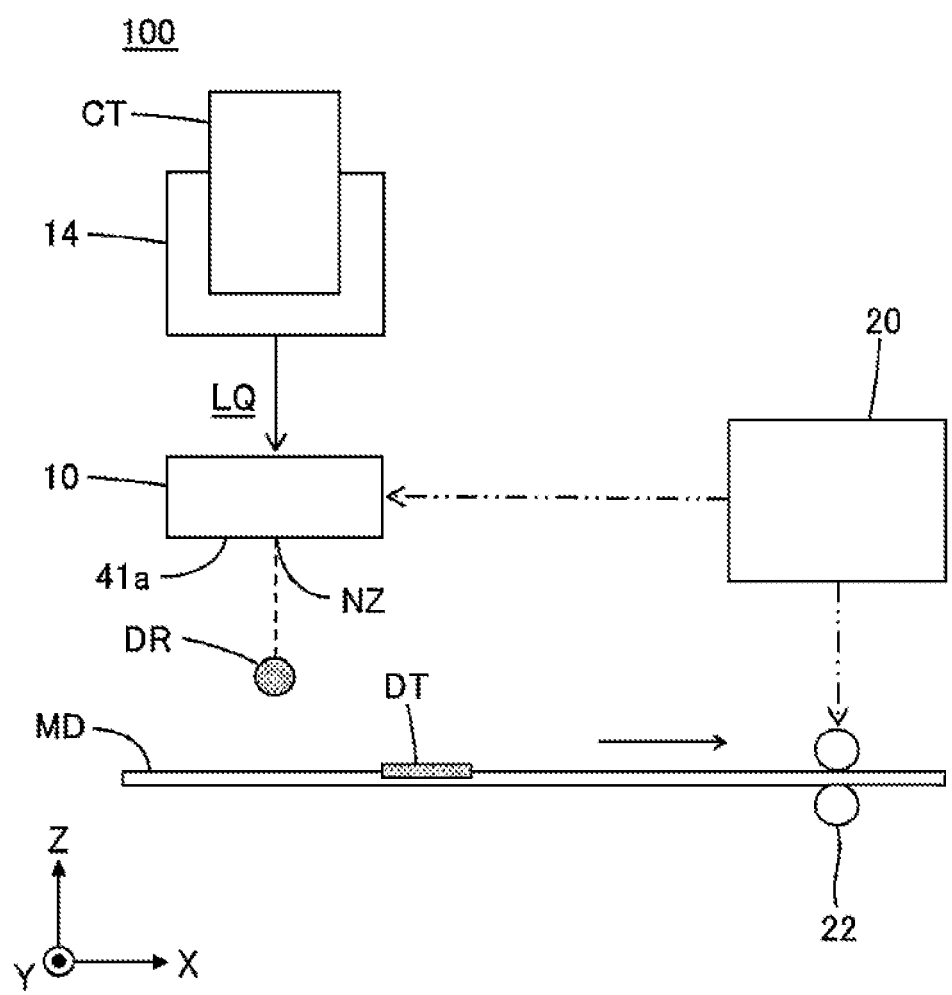
FIG. 1 is a diagram schematically illustrating an example of a liquid discharging apparatus.

Hereinafter, an exemplary embodiment of the present disclosure will be described. It goes without saying that the exemplary embodiment hereinafter is merely an exemplification of the present disclosure and the features described in the exemplary embodiment are not all necessarily essential in the solution of the disclosure.

1. OUTLINE OF TECHNIQUES INCLUDED IN PRESENT DISCLOSURE

An outline of the techniques included in the present disclosure will be described first. Note that FIGS. 1 to 18 in the present application are drawings that illustrate examples in a schematic manner; accordingly, the magnification ratio in each direction illustrated in each drawing may be different and the drawings may not be consistent with each other. It goes without saying that the elements of the present technique are not limited to those in the specific examples denoted by reference numerals. In the "Outline of Techniques Included in Present Disclosure", a phrase in parentheses additionally describes the immediately preceding word.

Furthermore, a numerical range "Min to Max" denotes a numerical range from a minimum value Min or larger to a maximum value Max or smaller. A composition ratio expressed by a chemical formula indicates a stoichiometric ratio, and a substance expressed by a chemical formula includes those that are outside the stoichiometric ratio.

Figure 4:
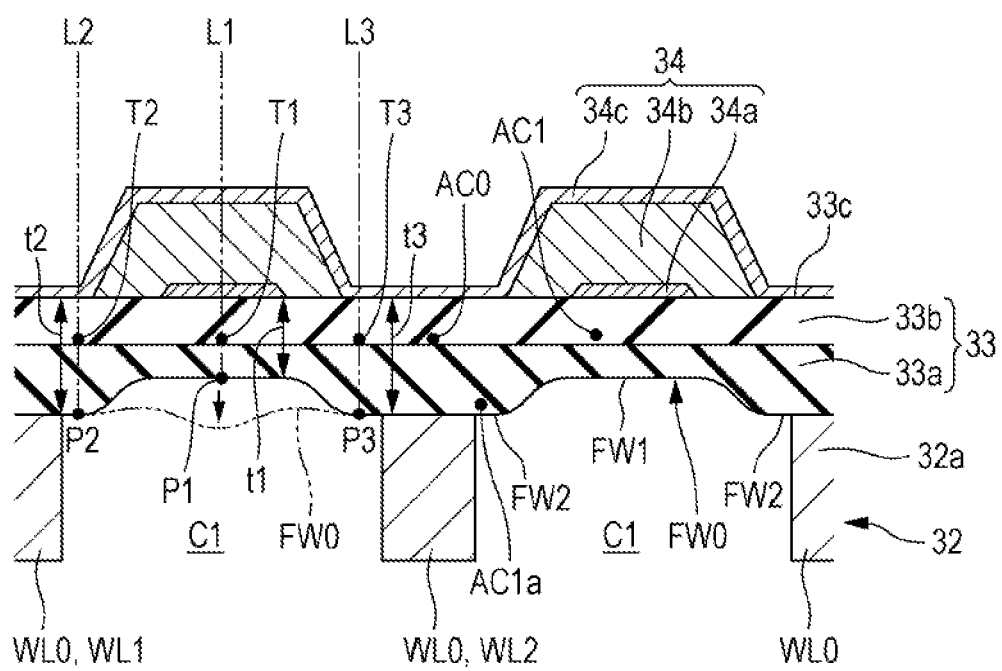
FIG. 4 is a cross-sectional view schematically illustrating an example of an essential portion of the liquid discharging head.

As illustrated as an example in FIG. 4 and the other drawings, a liquid discharging head 10 according to an aspect of the present technique is provided with, in order in a first direction (a +Z direction), a pressure chamber partitioning portion (a pressure chamber substrate body portion 32a, for example) that includes a plurality of partitioning walls WL0 that partition pressure chambers C1 in which a pressure that discharges a liquid LQ is applied to the liquid LQ, a diaphragm 33 that includes wall surfaces FW0 that face the pressure chambers C1, and piezoelectric substances 34b. The plurality of partitioning walls WL0 include first partitioning walls WL1 and second partitioning walls WL2. The pressure chambers C1 are located between the first partitioning walls WL1 and the second partitioning walls WL2 in a second direction (a Y-axis direction, for example) that intersects the first direction (the +Z direction, for example). Each wall surface FW0 of the diaphragm 33 includes a first portion P1 at a first position L1, in which a distance D1 between the first position L1 and the first partitioning wall WL1 is equivalent to or smaller than a distance D2 between the first position L1 and the second partitioning wall WL2 in the second direction (the Y-axis direction), and a second portion P2 at a second position L2 between the first position L1 and the first partitioning wall WL1 in the second direction (the Y-axis direction). The position of the second portion P2 in the first direction (the +Z direction) is, with respect to the position of the first portion P1 in the first direction (the +Z direction), on an opposite side SR1 in a first direction (the +Z direction).

Figure 18:
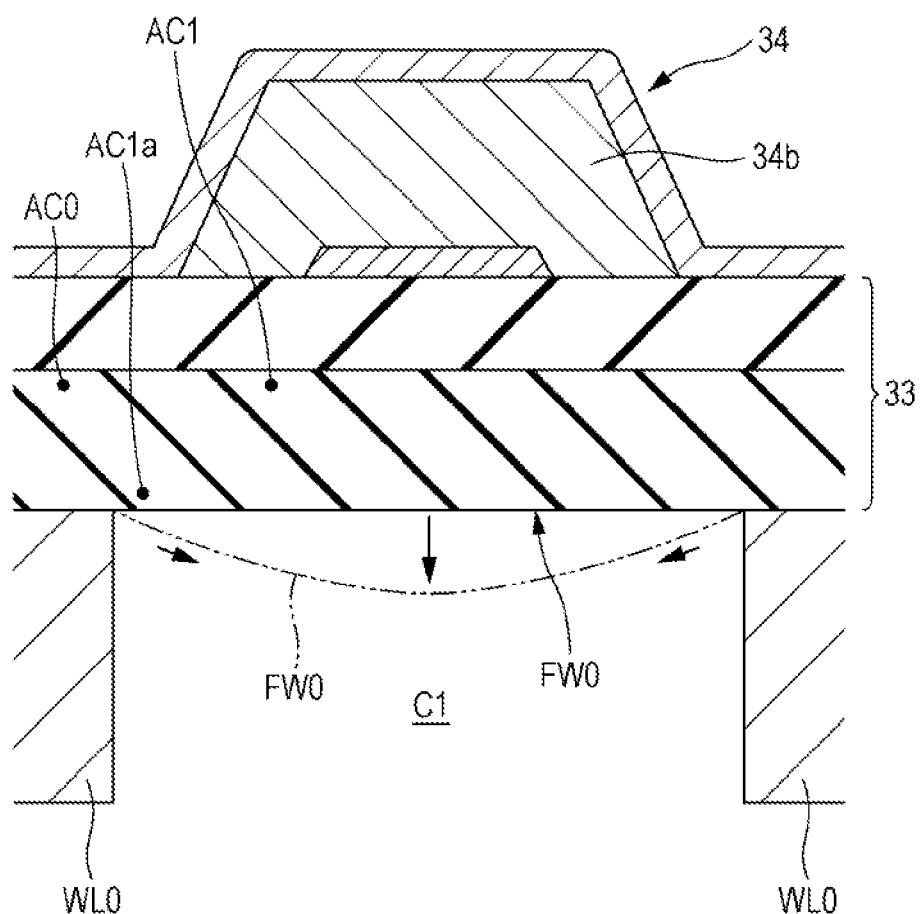
FIG. 18 is a cross-sectional view schematically illustrating, as an example, an essential portion of a liquid discharging head according to a comparative example.

Note that in the diaphragm, wall surfaces of pressure chamber corresponding portions AC1 that face the pressure chambers are referred to as diaphragm wall surfaces. FIG. 18 is a cross-sectional view schematically illustrating, as an example, an essential portion of a liquid discharging head according to a comparative example. As illustrated in FIG. 18, in a case in which the diaphragm wall surface FW0 is flat during a drive voltage non-application period, in which no drive voltage is applied to the piezoelectric substance 34b of a piezoelectric element 34, when the diaphragm 33 is bent towards the pressure chamber C1 to discharge a liquid, the diaphragm wall surface FW0 is stretched in a manner illustrated by a two-dot chain line in FIG. 18. With the above, a region AC1a in the pressure chamber corresponding portion AC1 of the diaphragm 33, which is near a pressure chamber non-corresponding portion AC0, is in a state allowing cracking to occur easily.

Furthermore, also in a case in which the region in the diaphragm wall surface FW0 that is farther away from the pressure chamber non-corresponding portion AC0 than the region near the pressure chamber non-corresponding portion AC0 bulges towards the pressure chamber C1 (the position depicted by the two-dot chain line in FIG. 18, for example) during the drive voltage non-application period, when the diaphragm 33 becomes bent towards the pressure chamber C1 to discharge the liquid, the diaphragm wall surface FW0 becomes stretched. With the above, the region AC1a in the pressure chamber corresponding portion AC1 of the diaphragm 33, which is near the pressure chamber non-corresponding portion AC0, is in a state allowing cracking to occur easily.

In the aspect of the present technique described above, in the diaphragm wall surface FW0, the second portion P2 that is relatively near the first partitioning wall WL1 bulges towards the pressure chamber C1 with respect to the first portion P1 that is relatively far from the first partitioning wall WL1. Accordingly, when the diaphragm 33 becomes bent towards the pressure chamber C1 to discharge the liquid LQ, since the diaphragm 33 first becomes bent so that the areas of the diaphragm wall surfaces FW0 become smaller, stretching of the diaphragm wall surfaces FW0 is suppressed. With the above, the region AC1a in the pressure chamber corresponding portion AC1 of the diaphragm 33, which is near the pressure chamber non-corresponding portion AC0, is in a state that does not allow cracking to occur easily. Accordingly, the above-described aspect of the present technique is capable of providing a liquid discharging head that is configured to suppress cracking from occurring in the diaphragm.

Furthermore, when the diaphragm wall surface FW0 is depressed so that the portion far from the pressure chamber non-corresponding portion AC0 is closer to the piezoelectric substance 34b than the portion near the pressure chamber non-corresponding portion AC0, the amount of liquid LQ entering the pressure chamber C1 in advance increases. The liquid discharging capacity and refilling performance of the liquid discharging head are improved with the above.

Figure 5:
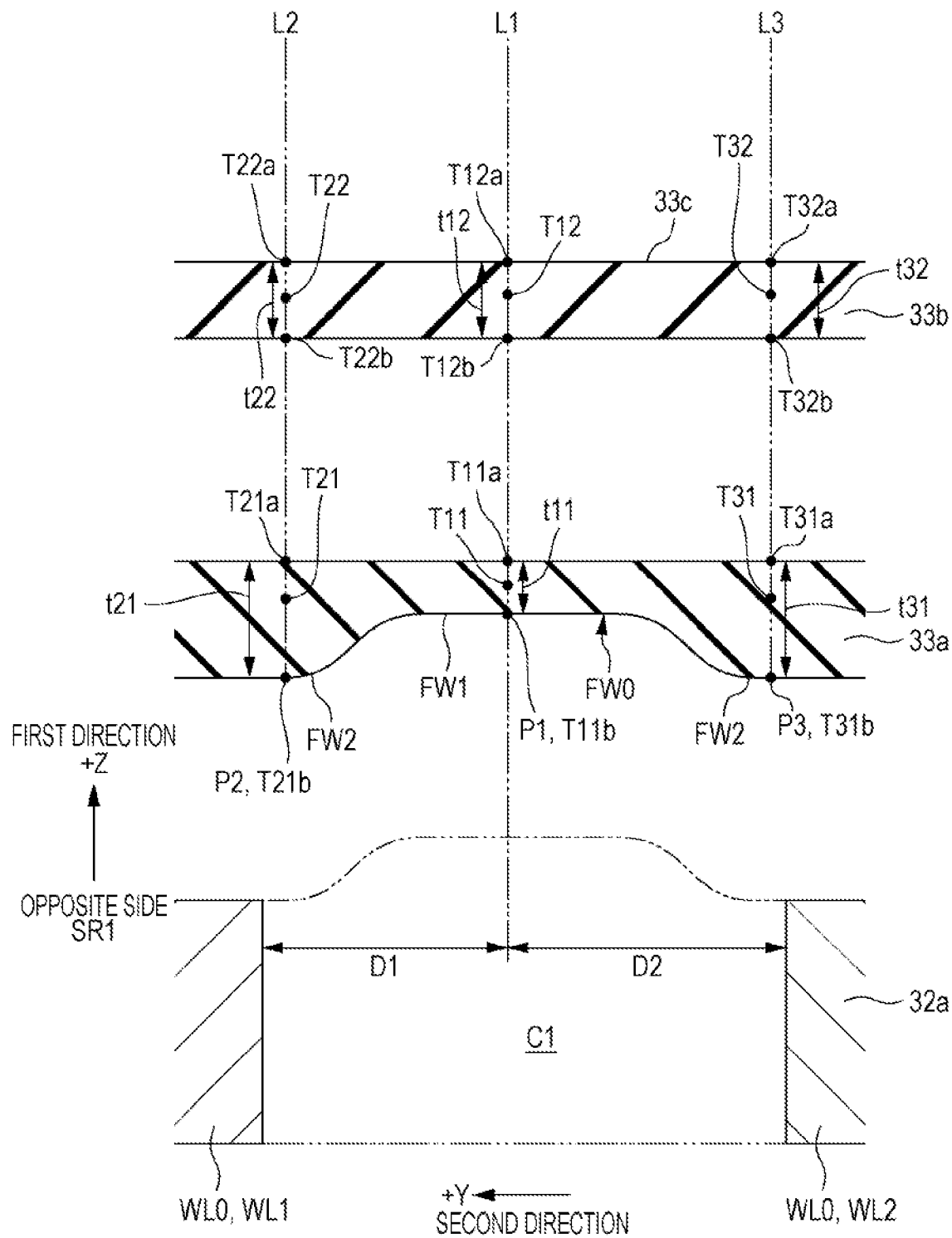
FIG. 5 is a cross-sectional view schematically illustrating, in an exploded manner, an example of a pressure chamber partitioning portion, an elastic layer, and an insulating layer.
Figure 6:
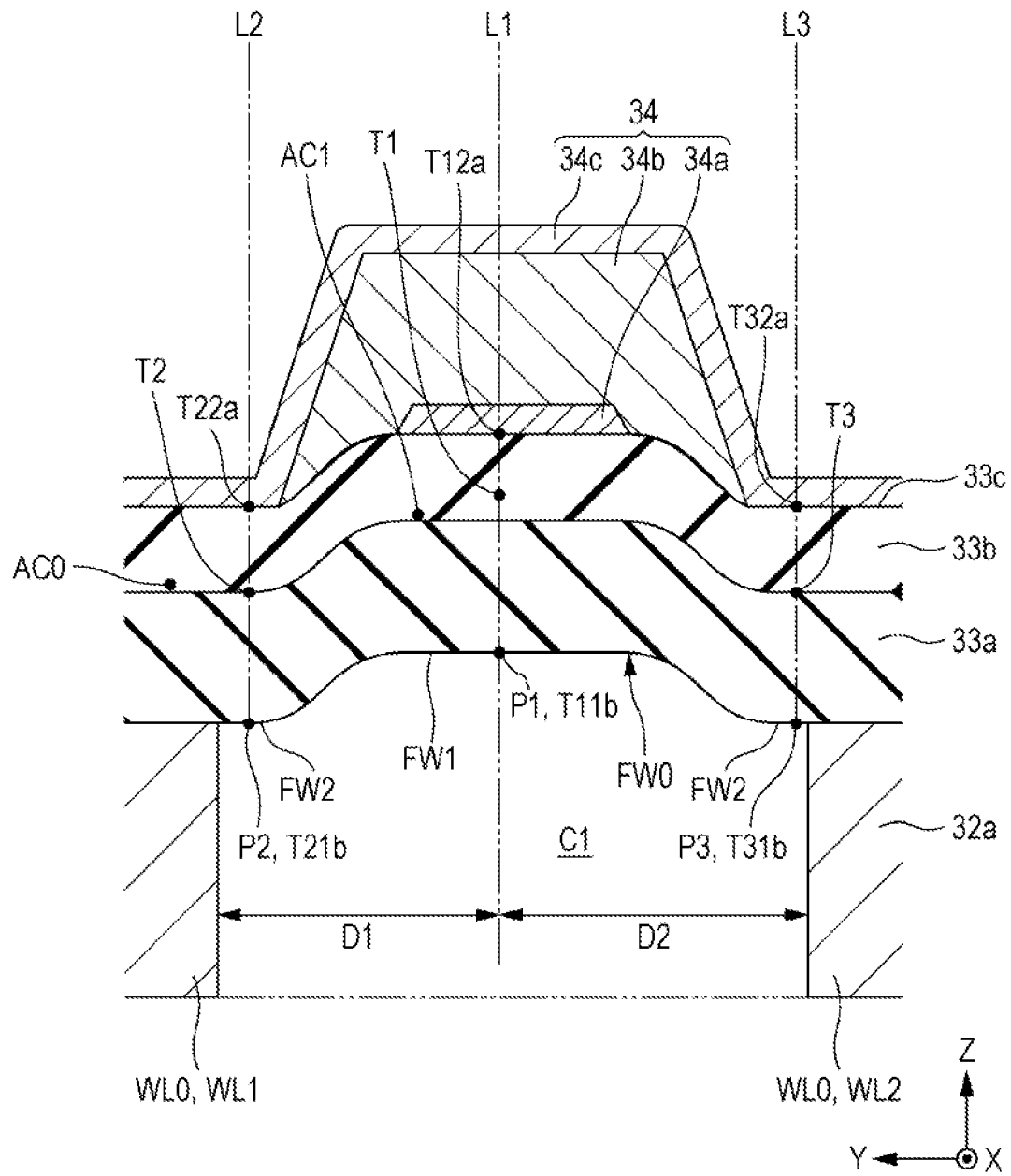
FIG. 6 is a cross-sectional view schematically illustrating an example of an essential portion of the liquid discharging head that includes, in the piezoelectric element disposing surface, a protruded portion that matches a recessed portion of a diaphragm wall surface.
Figure 7:
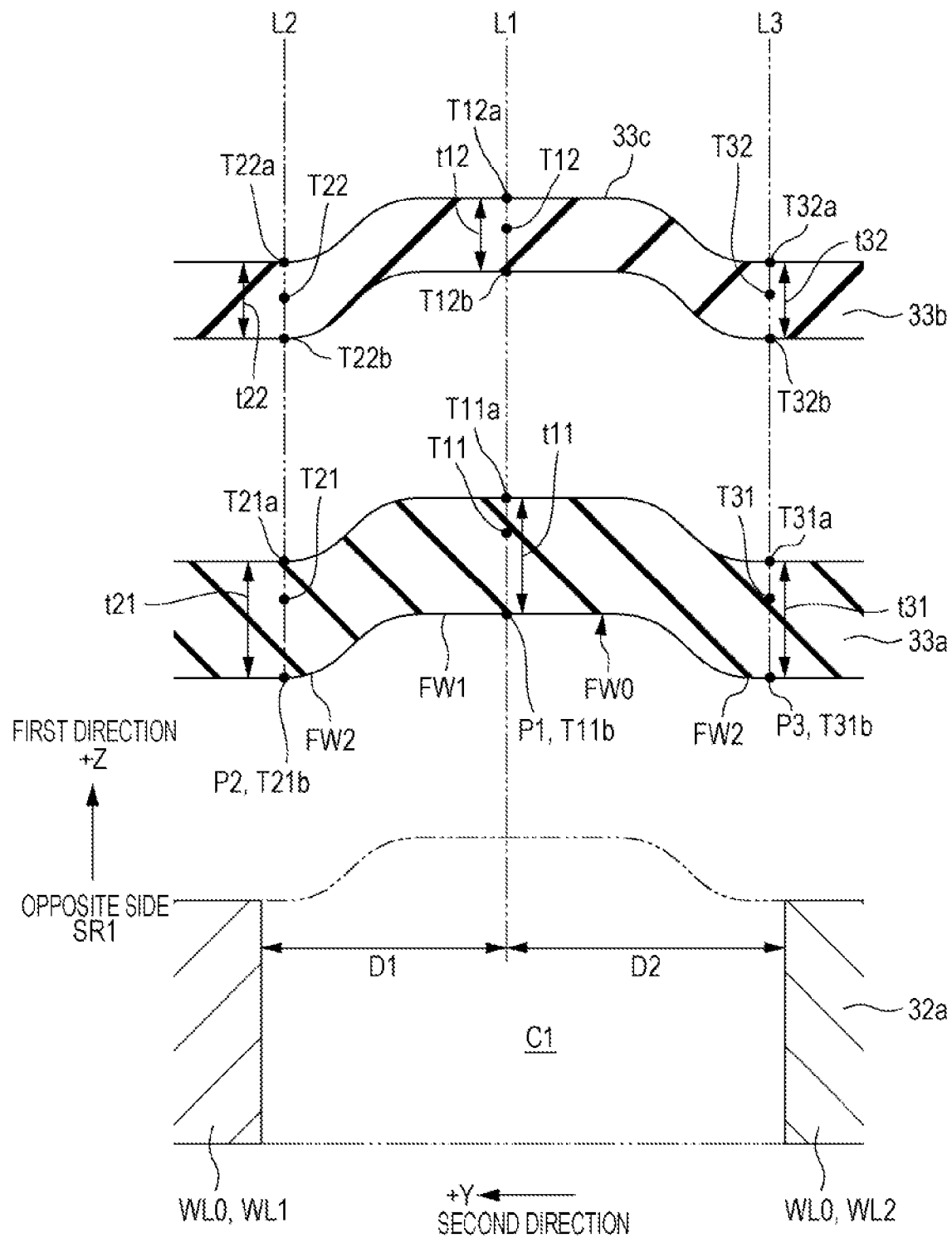
FIG. 7 is a cross-sectional view schematically illustrating, in an exploded manner, an example of the pressure chamber partitioning portion, the elastic layer, and the insulating layer.
Figure 8:
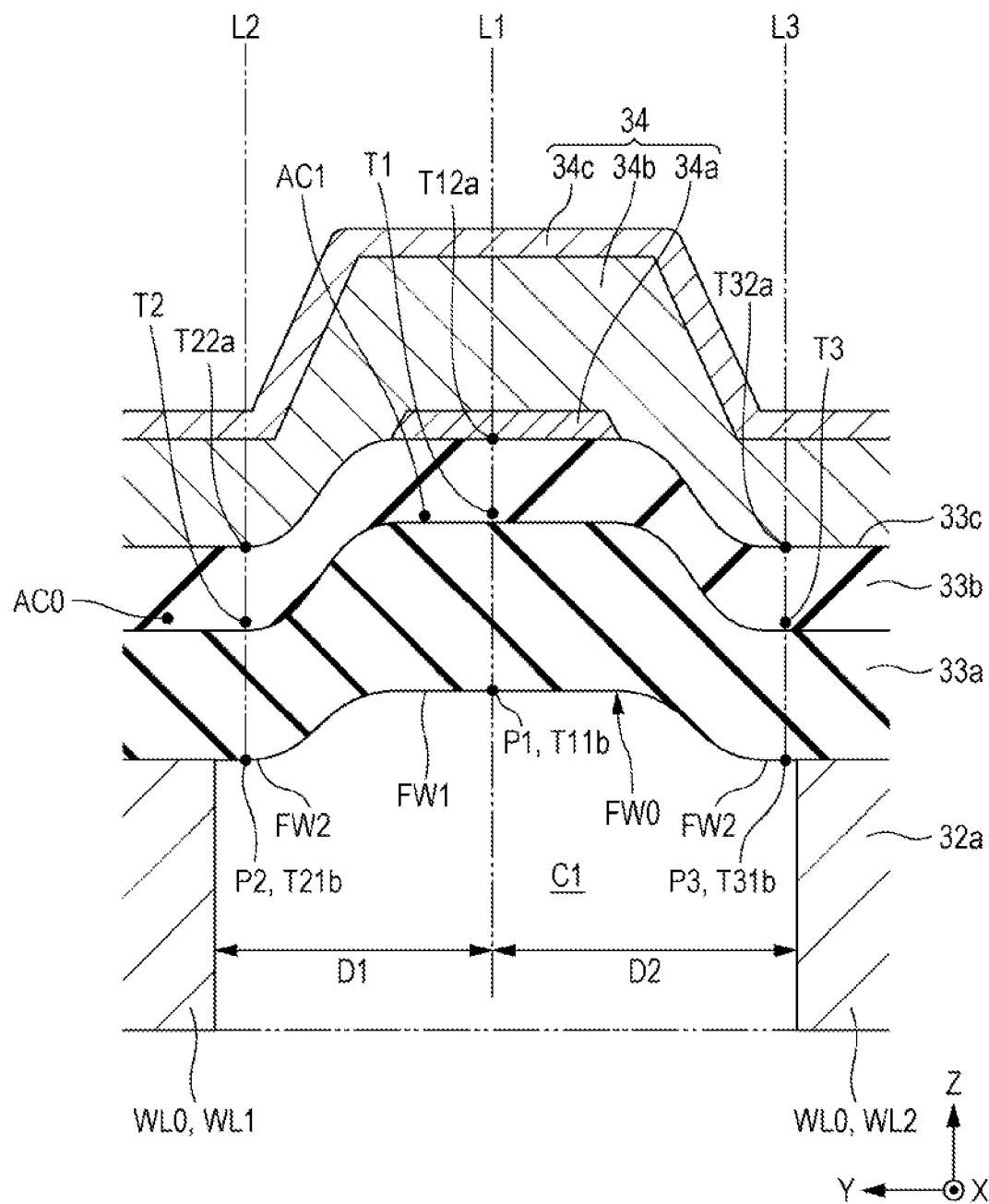
FIG. 8 is a cross-sectional view schematically illustrating an example of an essential portion of the liquid discharging head that includes, in the piezoelectric element disposing surface, a protruded portion that is higher than a depth of the recessed portion of the diaphragm wall surface.
Figure 9:
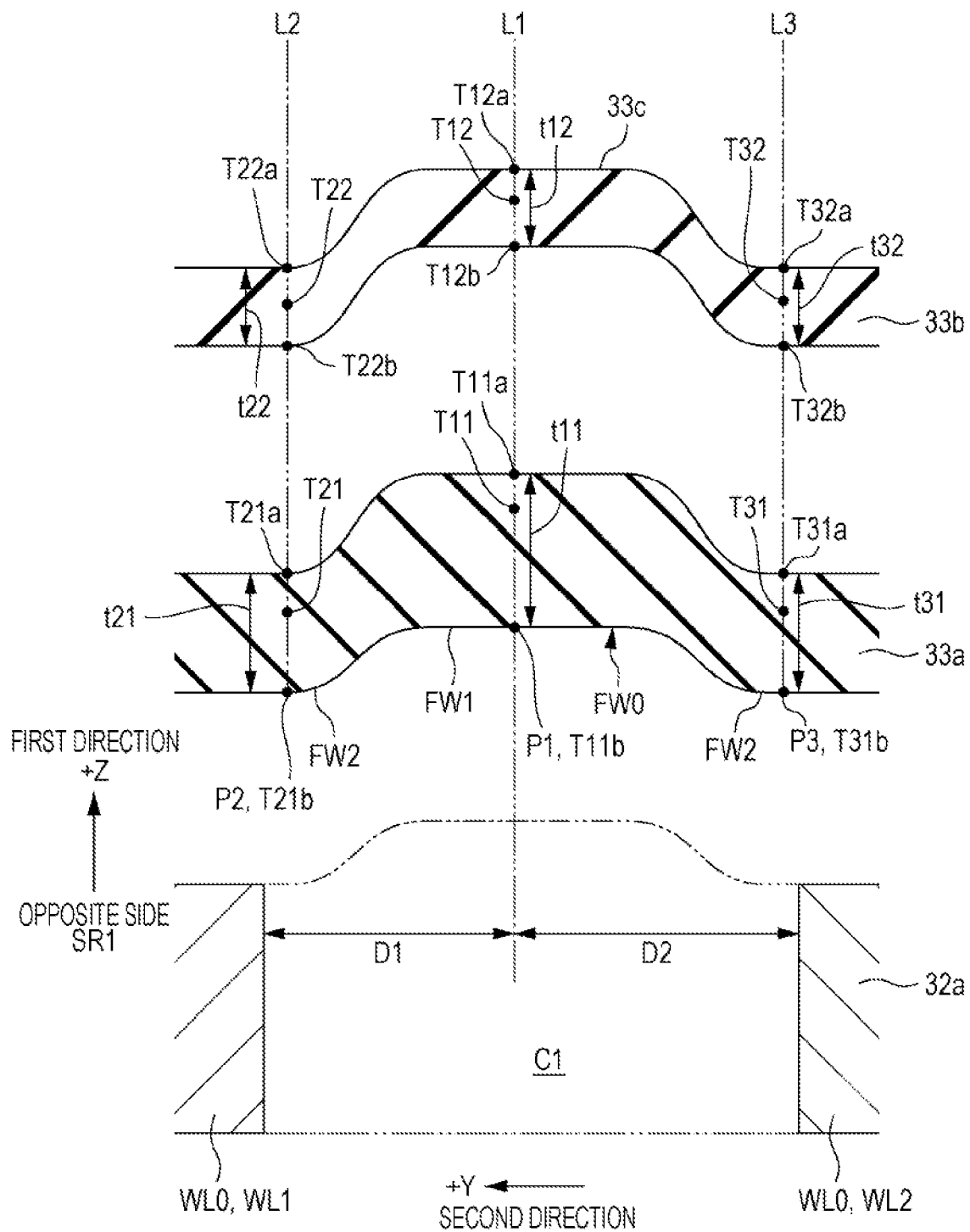
FIG. 9 is a cross-sectional view schematically illustrating, in an exploded manner, an example of the pressure chamber partitioning portion, the elastic layer, and the insulating layer.

The terms used in the present specification will be described with reference to FIGS. 5, 7, 9, and the other drawings. Based on the liquid discharging head 10 illustrated in FIG. 4, FIG. 5 illustrates, for the sake of description, the pressure chamber partitioning portion (32a), an elastic layer 33a, and an insulating layer 33b in an exploded manner. Based on the liquid discharging head 10 illustrated in FIG. 6, FIG. 7 illustrates, for the sake of description, the pressure chamber partitioning portion (32a), the elastic layer 33a, and the insulating layer 33b in an exploded manner. Based on the liquid discharging head 10 illustrated in FIG. 8, FIG. 9 illustrates, for the sake of description, the pressure chamber partitioning portion (32a), the elastic layer 33a, and the insulating layer 33b in an exploded manner. Furthermore, the X-axis, the Y-axis, and the Z-axis are depicted in FIG. 1 and the other drawings to conveniently describe the positional relationship of the elements. The X-axis and the Y-axis are orthogonal to each other, the Y-axis and the Z-axis are orthogonal to each other, and the Z-axis and the X-axis are orthogonal to each other. Note that in the X-axis, the direction towards which the arrow points is the +X direction, and the direction opposite the +X direction is the −X direction. In the Y-axis, the direction towards which the arrow points is the +Y direction, and the direction opposite the +Y direction is the −Y direction. In the Z-axis, the direction towards which the arrow points is the +Z direction, and the direction opposite the +Z direction is the −Z direction. Furthermore, the +X direction and the −X direction are generically referred to as the X-axis direction, the +Y direction and the −Y direction are generically referred to as the Y-axis direction, and the +Z direction and the −Z direction are generically referred to as the Z-axis direction.

The "first direction (the +Z direction)" denotes a direction that extends from the pressure chamber partitioning portion (32a) towards the insulating layer 33b, and is the +Z direction in the examples in FIGS. 5, 7, 9, and the other drawings.

The "second direction (the Y-axis direction)" that intersects the first direction (the +Z direction) is a direction that specifies the first position L1, the second position L2, and a third position L3, and is the Y-axis direction in the examples in FIGS. 5, 7, 9, and the other drawings.

In positions in the first direction (the +Z direction), a portion being positioned on "the opposite side SR1 in the first direction (the +Z direction)" with respect to another portion means that the portion is, with respect to the another portion, located in a direction opposite the first direction (the +Z direction) when the portion and the another portion are projected along an axis extending in the first direction (the +Z direction). For example, in positions in the first direction (the +Z direction), the second portion P2 being positioned on "the opposite side SR1 in the first direction (the +Z direction)" with respect to the first portion P1 means that the second portion P2 is, with respect to the first portion P1, located in a direction opposite the first direction (the +Z direction) when the second portion P2 and the first portion P1 are projected along an axis extending in the first direction (the +Z direction).

In a certain region, "an end portion in the first direction (the +Z direction)" refers to a bound that is a portion of the region where the region does not exist any more in the first direction (the +Z direction). For example, an end portion of a first-elastic-layer thickness portion T11, which is at the first position L1, in the first direction (the +Z direction) is an end portion T11a.

In a certain region, "an end portion on the opposite side SR1 in the first direction (the +Z direction)" refers to a bound that is a portion of the region where the region does not exist any more in a direction opposite the first direction (the +Z direction). For example, an end portion of the first-elastic-layer thickness portion T11, which is at the first position L1, on the opposite side SR1 in the first direction (the +Z direction) is an end portion T11b.

Note that in the liquid discharging head 10 according to the above-described aspect, the positional relationship between the piezoelectric substances 34b, the diaphragm 33, and the pressure chamber partitioning portions (32a) can be rephrased in the following manner. The liquid discharging head 10 includes the piezoelectric substances 34b, the diaphragm 33 that is provided on a first side in the Z-axis direction with respect to the piezoelectric substances 34b, and the pressure chamber partitioning portion (32a) that is provided on the first side in the Z-axis direction with respect to the diaphragm 33. In such a case, in a certain region, "an end portion on the opposite side SR1 in the first direction (the +Z direction)" can be rephrased as, in the region, an end portion on the first side in the Z-axis direction. Furthermore, in a certain region, "the end portion in the first direction (the Z-axis direction)" can be rephrased as, in the region, an end portion on a second side in the Z-axis direction.

The diaphragm 33 may include, in order in the first direction (the +Z direction), the elastic layer 33a and the insulating layer 33b. The elastic layer 33a may include the first-elastic-layer thickness portion T11 at the first position L1 and a second-elastic-layer thickness portion T21 at the second position L2. The insulating layer 33b may include a first-insulating-layer thickness portion T12 at the first position L1 and a second-insulating-layer thickness portion T22 at a second position L2.

In the second-elastic-layer thickness portion T21, a position, in the first direction (the +Z direction), of an end portion T21a in the first direction (the +Z direction) may be on the opposite side SR1 in the first direction (the +Z direction) with respect to an end portion T11a of the first-elastic-layer thickness portion T11 in the first direction (the +Z direction), or the position in the first direction (+Z direction) may be substantially the same as that of the end portion T11a of the first-elastic-layer thickness portion T11 in the first direction (the +Z direction). Note that a position of a certain portion and a position of another portion being substantially the same in the first direction (the +Z direction) denotes that a distance between the position of the certain portion and the position of the another portion is 0.2 times or less than a thickness of the another portion.

In the second-insulating-layer thickness portion T22, a position, in the first direction (the +Z direction), of an end portion T22a in the first direction (the +Z direction) may be on the opposite side SR1 in the first direction (the +Z direction) with respect to an end portion T12a of the first-insulating-layer thickness portion T12 in the first direction (the +Z direction), or the position in the first direction (+Z direction) may be substantially the same as that of the end portion T12a of the first-insulating-layer thickness portion T12 in the first direction (the +Z direction).

In the second-insulating-layer thickness portion T22, a position, in the first direction (the +Z direction), of an end portion T22b on the opposite side SR1 in the first direction (the +Z direction) may be on the opposite side SR1 in the first direction (the +Z direction) with respect to an end portion T12b of the first-insulating-layer thickness portion T12 on the opposite side SR1 in the first direction (the +Z direction), or the position in the first direction (+Z direction) may be substantially the same as that of the end portion T12b of the first-insulating-layer thickness portion T12 on the opposite side SR1 in the first direction (the +Z direction).

The wall surface FW0 of the diaphragm 33 may further include a third portion P3 at the third position L3, which is between the first position L1 and the second partitioning wall WL2 in the second direction (the Y-axis direction). A position of the third portion P3 in the first direction (the +Z direction) may be on the opposite side SR1 in the first direction (the +Z direction) with respect to the first portion P1.

Furthermore, as illustrated as an example in FIG. 1, a liquid discharging apparatus 100 according to an aspect of the present technique includes an aspect of including the liquid discharging head 10 and a control portion 20 that controls a discharging operation of the liquid LQ from the liquid discharging head 10. Such an aspect is capable of providing a liquid discharging apparatus configured to suppress cracking from occurring in the diaphragm.

As illustrated as an example in FIGS. 10 to 17, a method of manufacturing the liquid discharging head 10 according to an aspect of the present technique is a method of manufacturing a liquid discharging head 10 provided with, in order in the first direction (the +Z direction), the pressure chamber partitioning portion (32a) that includes the plurality of partitioning walls WL0 that partition the pressure chambers C1 in which a pressure that discharges the liquid LQ is applied to the liquid LQ, the diaphragm 33 that includes wall surfaces FW0 that face the pressure chambers C1, and the piezoelectric substances 34b. The plurality of partitioning walls WL0 include the first partitioning walls WL1 and the second partitioning walls WL2. The pressure chambers C1 are located between the first partitioning walls WL1 and the second partitioning walls WL2 in the second direction (the Y-axis direction) that intersects the first direction (the +Z direction). Each wall surface FW0 of the diaphragm 33 includes the first portion P1 at the first position L1, in which the distance D1 between the first position L1 and the first partitioning wall WL1 is equivalent to or smaller than the distance D2 between the first position L1 and the second partitioning wall WL2 in the second direction (the Y-axis direction), and the second portion P2 at the second position L2 between the first position L1 and the first partitioning wall WL1 in the second direction (the Y-axis direction). The manufacturing method includes an oxide film forming step (for example, a pre-thermal oxidation step ST1 and a thermal oxide film patterning step ST2) in which an oxide film 92 is formed on a surface 132a of a substrate (132) in which the pressure chambers C1 are formed so that, in the second direction (the Y-axis direction), the oxide film 92 exists at the first position L1 and does not exist at the position corresponding to the first partitioning wall WL1, a thermal oxidation step ST3 that applies thermal oxidation to the surface 132a of the substrate (132) on which the oxide film 92 has been formed so that the thermal oxide layer 93 included in the diaphragm 33 is formed so that the second portion P2 in the first direction (the +Z direction) is positioned on the side SR1 in the direction opposite the first direction (the +Z direction) with respect to the position of the first portion P1 in the first direction (the +Z direction), and a pressure chamber forming step ST6 that forms the pressure chambers C1 by leaving behind the thermal oxide layer 93 from the substrate on which the thermal oxide layer 93 has been formed.

In the above-described aspect of the present technique, the diffusion of oxygen that passes through the oxide film 92 to the substrate in the thermal oxidation step ST3 is smaller than the diffusion of oxygen to the substrate in the portion with no oxide film 92; accordingly, the thermal oxide layer 93 is formed so that the second portion P2 is, in the first direction (the +Z direction), positioned on the opposite side SR1 in the first direction (the +Z direction) with respect to the first portion P1. In the pressure chamber forming step ST6, the pressure chambers C1 are formed so that the wall surfaces FW0 of the thermal oxide layer 93 become the wall surfaces FW0 of the diaphragm 33. As a result, in each diaphragm wall surface FW0, the second portion P2 that is relatively near the first partitioning wall WL1 bulges towards the pressure chamber C1 with respect to the first portion P1 that is relatively far from the first partitioning wall WL1. Accordingly, when the diaphragm 33 is bent towards the pressure chambers C1 to discharge the liquid LQ, the diaphragm 33 is first bent so that the areas of the diaphragm wall surfaces FW0 become smaller; accordingly, stretching of the diaphragm wall surfaces FW0 can be suppressed. With the above, the region AC1a in the pressure chamber corresponding portion AC1 of the diaphragm 33, which is near the pressure chamber non-corresponding portion AC0, is in a state that does not allow cracking to occur easily. Accordingly, the above-described aspect of the present technique is capable of providing a method of manufacturing a liquid discharging head that is configured to suppress cracking from occurring in the diaphragm.

Note that the diaphragm and each piezoelectric substance being provided in that order in the first direction include a case in which there is a portion where the diaphragm and each piezoelectric substance do not overlap each other.

The "first", the "second", the "third", and so on in the present application are terms to distinguish the components included in the plurality of components that are similar to each other and do not indicate any sequential order.

(2) SPECIFIC EXAMPLE OF LIQUID DISCHARGING APPARATUS

FIG. 1 schematically illustrates, as an example, a configuration of the liquid discharging apparatus 100 including the liquid discharging head 10.

The liquid discharging apparatus 100 illustrated in FIG. 1 includes a feeding portion 14 that feeds the liquid LQ, the liquid discharging head 10, a transport portion 22 through which a medium MD is transported, and the control portion 20.

A liquid container CT that stores the liquid LQ is mounted on the feeding portion 14. A rigid container made of synthetic resin, a bag-shaped soft pack formed of flexible film, a liquid tank in which the liquid LQ can be filled, and the like can be used as the liquid container CT. When the liquid LQ is ink, the rigid container is also referred to as an ink cartridge, and the soft pack is also referred to as an ink pack. The feeding portion 14 feeds the liquid LQ to the liquid discharging head 10.

According to control of the control portion 20, the liquid discharging head 10 discharges the liquid LQ, as droplets DR, onto a medium MD through nozzles NZ. Due to the design, the discharging direction of the droplets DR is the −Z direction. When the medium MD is the subject of printing, the medium MD is a material that holds a plurality of dots DT formed by the plurality of droplets DR. Paper, synthetic resin, fabric, metal, and the like can be used as the medium MD. The shape of the medium MD is not limited to any particular shape and may be a rectangular shape, a roll shape, a substantially circular shape, a polygonal shape other than a rectangular shape, a three-dimensional shape, and the like. When a printed image is formed on the medium MD by discharging, as droplets DR, ink drops, the liquid discharging apparatus 100 is referred to as an ink jet printer.

Note that the liquid LQ widely includes ink, synthetic resin such as photo-curing resin, liquid crystal, etching solution, bio organic matter, a lubricating liquid, and the like. The ink widely includes solution in which dye and the like have been melted in a solvent, sol in which solid particles such as pigment or metal particles have been dispersed in a dispersion medium, and the like.

According to the control of the control portion 20, the transport portion 22 transports the medium MD in the +X direction. When the liquid discharging apparatus 100 is a line printer, the plurality of nozzles NZ of the liquid discharging head 10 is disposed across the entire medium MD in the Y-axis direction. Furthermore, as is the case of a serial printer, the liquid discharging apparatus 100 may be provided with a reciprocating driving portion that moves the liquid discharging head 10 in the +Y direction and the −Y direction.

A circuit including, for example, a CPU, an FPGA, ROM, RAM, and the like may be used in the control portion 20. Note that CPU is an abbreviation for central processing unit, FPGA is an abbreviation for field programmable gate array, ROM is an abbreviation for read only memory, and RAM is an abbreviation for random access memory. Furthermore, the control portion 20 may be a circuit including a system on chip, which is abbreviated as SoC. The control portion 20 controls the portions included in the liquid discharging apparatus 100 to control the operation of discharging the droplets DR from the liquid discharging head 10.

In a case in which the liquid discharging apparatus 100 is an ink jet printer, when the medium MD is transported by the transport portion 22 and the plurality of droplets DR discharged from the liquid discharging head 10 land on the medium MD, a plurality of dots DT are formed on the medium MD. A printed image is formed on the medium MD with the above.

(3) SPECIFIC EXAMPLE OF LIQUID DISCHARGING HEAD

Figure 2:
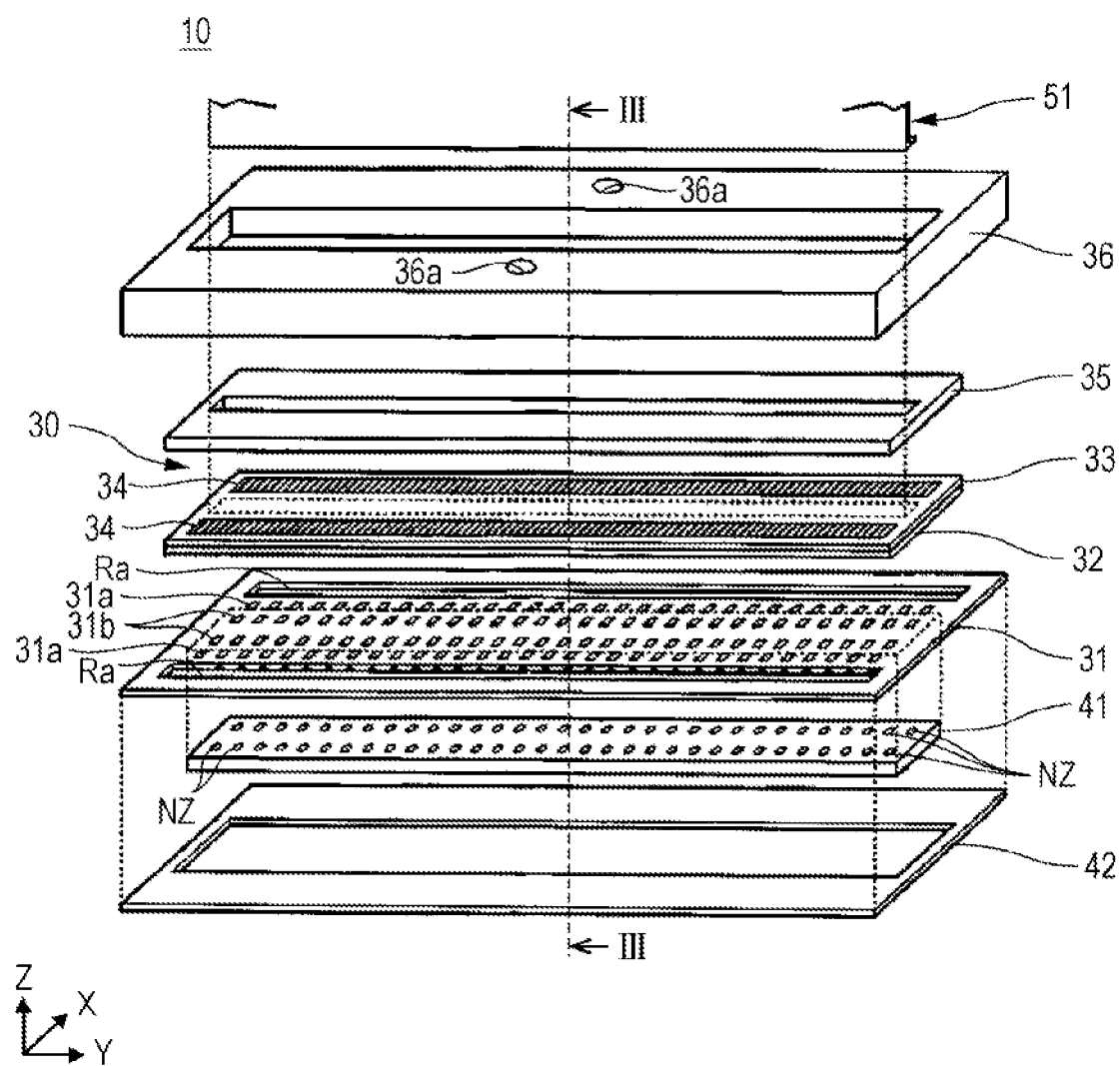
FIG. 2 is an exploded perspective view schematically illustrating an example of a structure of a liquid discharging head.
Figure 3:
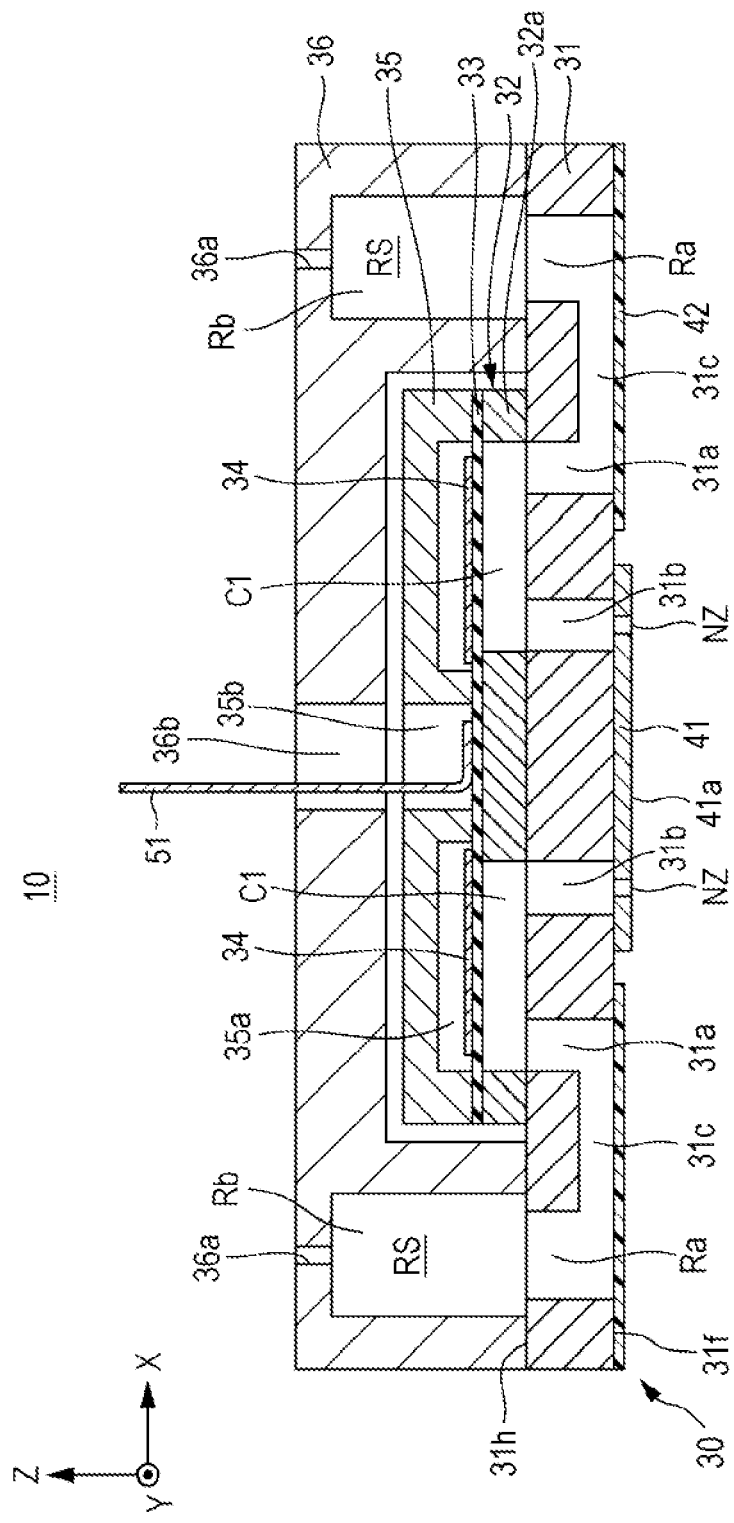
FIG. 3 is a cross-sectional view schematically illustrating an example of the liquid discharging head at a position along III-III in FIG. 2.

FIG. 2 is an exploded perspective view schematically illustrating, as an example, a structure of the liquid discharging head 10. FIG. 3 is a cross-sectional view schematically illustrating, as an example, the liquid discharging head 10 at a position along III-III in FIG. 2. FIG. 4 is a cross-sectional view schematically illustrating, as an example, a section of an essential portion of the liquid discharging head 10 orthogonal to the X-axis. Note that to bond a first member and a second member to each other includes bonding the first member and the second member to each other while in a state in which at least one layer of film, such as a protective film or the like, is layered on at least either one of the first member and the second member, and bonding the first member and the second member to each other with an adhesive agent in between.

The liquid discharging head 10 illustrated in FIGS. 2 to 4 includes a nozzle substrate 41, a compliance substrate 42, a communication substrate 31, a pressure chamber substrate 32 in which the diaphragm 33, the piezoelectric elements 34, and the like are integrated, a protective substrate 35, a housing member 36, and a wiring substrate 51. Note that the communication substrate 31, the pressure chamber substrate 32, the nozzle substrate 41, and the compliance substrate 42 are generically referred to as a flow path structure 30. The flow path structure 30 is a structure including therein a flow path to feed the liquid LQ to the nozzles NZ. Members included in the flow path structure 30 are plate-shaped members in which the longitudinal direction thereof are elongated along the Y-axis. The liquid discharging head 10 at a position passing through the protective substrate 35 in the X-axis direction includes, in order in the +Z direction, the nozzle substrate 41 and the compliance substrate 42, the communication substrate 31, the pressure chamber substrate 32, and the protective substrate 35, The nozzle substrate 41 is a plate-shaped member bonded to an end surface 31f of the communication substrate 31 in the −Z direction and includes the plurality of nozzles NZ that discharge the liquid LQ. The nozzle substrate 41 illustrated in FIG. 2 includes two nozzle rows, each having the plurality of nozzles NZ aligned in the Y-axis direction. Accordingly, the Y-axis direction is a direction in which the nozzles are aligned. Note that as illustrated in FIGS. 1 and 3, a surface in the nozzle substrate 41 through which the droplets DR are discharged is referred to as a nozzle surface 41a. Each nozzle NZ is coupled to a communication hole 31b of the communication substrate 31 and is a circular hole penetrating through the nozzle substrate 41 in the Z-axis direction, which is the thickness direction of the nozzle substrate 41. There are a plurality of nozzles NZ open in the nozzle surface 41a. Accordingly, the nozzle NZ is also referred to as a nozzle opening. The nozzle substrate 41 may be, for example, formed of one or more types of material selected from a silicon substrate, metal, such as stainless steel, and the like. The nozzle substrate 41 is formed by processing a silicon single crystal substrate using a semiconductor manufacturing technique such as, for example, photolithography and etching. It goes without saying that any known materials and manufacturing methods may be adopted to form the nozzle substrate 41.

A liquid repelling film having a liquid repelling property may be provided on the nozzle surface 41a. The liquid repelling film is not limited to any particular film as long as the film has a liquid repelling property and, for example, a metal film containing fluorine-based polymer, a metalalkoxide molecular film having a liquid repelling property, and the like may be used.

The compliance substrate 42 is, at a portion outside the nozzle substrate 41, bonded to the end surface 31f of the communication substrate 31. The compliance substrate 42 illustrated in FIG. 3 seals spaces Ra included in liquid storage chambers RS common to the plurality of nozzles NZ, and relay liquid chambers 31c common to the plurality of nozzles NZ. The compliance substrate 42 includes a flexible sealing film, for example. For example, a flexible film with a thickness of 20 μm or less may be used for the sealing film. Polyphenylene sulfide abbreviated as PPS, stainless steel, and the like may be used for the sealing film. The compliance substrate 42 constitutes wall surfaces of the liquid storage chambers RS and absorbs the changes in pressure of the liquid LQ inside the liquid storage chambers RS.

The communication substrate 31 is disposed between the nozzle substrate 41 and the compliance substrate 42, and the pressure chamber substrate 32 and the housing member 36. The pressure chamber substrate 32 and the housing member 36 are bonded to an end surface 31h of the communication substrate 31 in the +Z direction. The communication substrate 31 includes spaces Ra each common to the corresponding plurality of nozzles NZ, the relay liquid chambers 31c each common to the corresponding plurality of nozzles NZ, feed holes 31a each separated for a corresponding nozzle NZ, and the communication holes 31b each separated for a corresponding nozzle NZ. Each space Ra is shaped so as to have an opening in which the longitudinal direction thereof is elongated along the Y-axis. Each relay liquid chamber 31c is a space in which the longitudinal direction thereof is elongated along the Y-axis and is coupled from the space Ra common to the corresponding plurality of nozzles NZ to the corresponding plurality of feed holes 31a. The communication substrate 31 illustrated in FIGS. 2 and 3 includes two rows of feed flow paths in which a plurality of feed holes 31a are aligned in the Y-axis direction. Each feed hole 31a is coupled to a corresponding pressure chamber C1 of the pressure chamber substrate 32 and is a hole penetrating through the communication substrate 31 in the Z-axis direction, which is the thickness direction of the communication substrate 31. In other words, the communication substrate 31 includes a plurality of feed holes 31a that communicate the relay liquid chambers 31c and the pressure chambers C1 to each other. Furthermore, the communication substrate 31 illustrated in FIGS. 2 and 3 includes two rows of communication flow paths in which a plurality of communication holes 31b are aligned in the Y-axis direction. Each communication hole 31b is coupled to a corresponding pressure chamber C1 of the pressure chamber substrate 32 and to a corresponding nozzle NZ of the nozzle substrate 41 and is a hole penetrating through the communication substrate 31 in the Z-axis direction, which is the thickness direction of the communication substrate 31. In other words, the communication substrate 31 includes a plurality of communication holes 31b that communicate the pressure chambers C1 and the nozzles NZ to each other. The communication holes 31b are positioned in the +Z direction with respect to the nozzles NZ.

The communication substrate 31 may be, for example, formed of one or more types of material selected from a silicon substrate, metal, ceramics, and the like. The communication substrate 31 is formed by processing a silicon single crystal substrate using a semiconductor manufacturing technique such as, for example, photolithography and etching. It goes without saying that any known materials and manufacturing methods may be adopted to form the communication substrate 31.

The pressure chamber substrate 32 includes the plurality of pressure chambers C1 in which pressure to discharge the liquid LQ through the nozzles NZ is applied to the liquid LQ. The pressure chamber substrate 32 includes, on a surface thereof on a side opposite the communication substrate 31, the diaphragm 33 and the piezoelectric elements 34. Note that a portion in the pressure chamber substrate 32 in the −Z direction with respect to the diaphragm 33 is referred to as the pressure chamber substrate body portion 32a.

The pressure chamber substrate body portion 32a is bonded to the end surface 31h of the communication substrate 31 in the +Z direction. The pressure chamber substrate body portion 32a includes the pressure chambers C1 that are each separated for the corresponding nozzle NZ. Each pressure chamber C1 is positioned between the nozzle substrate 41 and the diaphragm 33 and is a space in which the longitudinal direction thereof is elongated along the X-axis. The pressure chamber substrate body portion 32a includes two rows of pressure chambers in which a plurality of pressure chambers C1 are aligned in the Y-axis direction. Each pressure chamber C1 is, on one end side in the longitudinal direction, coupled to a corresponding feed hole 31a and is, on the other end side in the longitudinal direction, coupled to the corresponding communication hole 31b.

The pressure chamber substrate body portion 32a may be, for example, formed of one or more types of material selected from a silicon substrate, metal, ceramics, and the like. The pressure chamber substrate body portion 32a is formed by processing a silicon single crystal substrate using a semiconductor manufacturing technique such as, for example, photolithography and etching. In such a case, when a silicon oxide layer is formed on a surface of the silicon single crystal substrate by thermal oxidation and the like, the silicon oxide layer can be used as the diaphragm 33. It goes without saying that any known materials and manufacturing methods may be adopted to form the pressure chamber substrate body portion 32a.

The diaphragm 33 integrated with the pressure chamber substrate body portion 32a has elasticity and constitutes a portion of the wall surface of each pressure chamber C1. The diaphragm 33 may be, for example, formed of one or more types of material selected from silicon oxide abbreviated as SiOx, metal oxide, ceramics, synthetic resin, and the like. Regarding the stoichiometric ratio, SiOx is silicon dioxide $SiO_2$; however, in actuality, there may be a deviation regarding x=2. The diaphragm 33 can be formed by, for example, thermal oxidation, physical vapor deposition including sputtering, an evaporation method including CVD, a liquid-phase method including spin coating, and the like. Note that CVD is an abbreviation for chemical vapor deposition.

As illustrated in FIG. 4, the diaphragm 33 may include a plurality of layers including the elastic layer 33a, the insulating layer 33b, and the like. For example, the diaphragm 33 is formed by layering, as the elastic layer 33a, SiOx on the pressure chamber substrate body portion 32a, and layering, as the insulating layer 33b, zirconium oxide abbreviated as ZrOx on the elastic layer 33a. In such a case, the main component of the elastic layer 33a is SiOx, and the main component of the insulating layer 33b is ZrOx. While the thickness of the elastic layer 33a is not limited to any particular thickness, the thickness can be from about 300 nm to about 2000 nm, for example. While the thickness of the insulating layer 33b is not limited to any particular thickness, the thickness can be from about 30 nm to about 600 nm, for example. The diaphragm 33 may further include a layer other than the elastic layer 33a and the insulating layer 33b.

It goes without saying that the materials of the diaphragm 33 may be, other than those described above, silicon nitride abbreviated as SiNx, titanium oxide abbreviated as TiOx, aluminum oxide abbreviated as AlOx, hafnium oxide abbreviated as HfOx, magnesium oxide abbreviated as MgOx, lanthanum aluminate, and the like.

The piezoelectric elements 34, the drive of each piezoelectric element 34 being separated for each corresponding pressure chamber C1, are integrated with a piezoelectric element disposing surface 33c, which is an end surface of the diaphragm 33 in the +Z direction. The piezoelectric elements 34 and the diaphragm 33 are included in the actuator that applies pressure to the pressure chambers C1. The pressure chamber substrate 32 illustrated in FIGS. 2 and 3 includes two rows of piezoelectric elements in which a plurality of piezoelectric elements 34 are aligned in the Y-axis direction. Each piezoelectric element 34 is a structure in which the longitudinal direction thereof is elongated along the X-axis. The piezoelectric elements 34 in the specific example are each to be a drive element that expands and contracts according to a drive signal that includes repetitive drive pulses having a change in voltage. For example, each piezoelectric element includes, as illustrated in FIG. 4, in order in the +Z direction and at a portion that overlaps a first electrode 34a, a layered first electrode 34a, a layered piezoelectric substance 34b, and a layered second electrode 34c. The piezoelectric element expands and contracts according to a voltage applied across the first electrode 34a and the second electrode 34c. Regarding the plurality of piezoelectric elements 34, it is only sufficient that at least one of the first electrodes 34a, the piezoelectric substances 34b, and the second electrode 34c are separated from each other. In other words, it is only sufficient that, in the plurality of piezoelectric elements 34, not all of the first electrodes 34a, a piezoelectric layer 34b, and the second electrode 34c are common members. Accordingly, in the plurality of piezoelectric elements 34, the first electrode 34a may be a common electrode that are coupled to each other, the second electrode 34c may be a common electrode that are coupled to each other, or the piezoelectric substances 34b may be coupled to each other. In the present specific example, the first electrode 34a is an individual electrode, the piezoelectric substance 34b is an individual piezoelectric substance, and the second electrode 34c is a common electrode.

The first electrodes 34a and the second electrode 34c can be formed of a conductive material such as, for example, metal such as iridium or platinum, or metal oxide such as indium tin oxide abbreviated as ITO. When the electrodes are formed of iridium, the main component of each electrode is iridium. In such a case, the electrode may be practically iridium, from which impurities have been removed, or may include a subcomponent, in which the content thereof is smaller than that of the main component. While the thickness of the first electrode 34a is not limited to any particular thickness, the thickness can be from about 50 nm to about 300 nm, for example. While the thickness of the second electrode 34c is not limited to any particular thickness, the thickness can be from about 15 nm to about 100 nm, for example.

The piezoelectric substance 34b can be formed of a material having a Perovskite structure such as, for example, lead zirconate titanate abbreviated as PZT, relaxor ferroelectric that is PZT added with either one of the metals including niobium, nickel, and the like, and lead-free perovskite oxide such as a BiFeOx-BaTiOy-based piezoelectric material. While the thickness of the piezoelectric substance 34b is not limited to any particular thickness, the thickness can be from about 0.7 μm to about 5 μm, for example.

The protective substrate 35 includes spaces 35a that protect the plurality of piezoelectric elements 34, and a through hole 35b through which the wiring substrate 51 is drawn out, and is bonded to the piezoelectric element disposing surface 33c that is the end surface of the diaphragm 33 in the +Z direction. With the above, the protective substrate 35 reinforces the mechanical strength of the pressure chamber substrate 32. The protective substrate 35 may be, for example, formed of one or more types of material selected from a silicon substrate, metal, ceramics, synthetic resin, and the like. The protective substrate 35 is formed by processing a silicon single crystal substrate using a semiconductor manufacturing technique such as, for example, photolithography and etching. It goes without saying that any known materials and manufacturing methods may be adopted to form the protective substrate 35.

The housing member 36 is, at a portion outside of the pressure chamber substrate 32 and the protective substrate 35, bonded to the end surface 31f of the communication substrate 31 in the +Z direction. The housing member 36 illustrated in FIG. 3 includes spaces Rb included in the liquid storage chambers RS common to the plurality of nozzles NZ, feed ports 36a coupled to an external portion through the spaces Rb, and a through hole 36b to draw out the wiring substrate 51. Each space Rb is shaped so as to have an opening in which the longitudinal direction thereof is elongated along the Y-axis. The end surface of the housing member 36 in the +Z direction is provided with openings of the feed ports 36a. The liquid LQ from the liquid container CT is fed to the feed ports 36a. The housing member 36 may be, for example, formed of one or more types of material selected from synthetic resin, metal, ceramics, and the like. The housing member 36 is formed by injection molding synthetic resin, for example. It goes without saying that any known materials and manufacturing methods may be adopted to form the housing member 36.

The wiring substrate 51 is a flexible mounted component including a drive circuit of the piezoelectric elements 34 and is coupled to the end surface of the diaphragm 33 in the +Z direction and at a portion between the rows of piezoelectric elements. A portion of the wiring substrate 51 coupled to the diaphragm 33 is coupled to the first electrodes 34a and the second electrode 34c through a lead wire, for example. An FPC, an FFC, a COF, or the like can be used as the wiring substrate 51. Note that FPC is an abbreviation for flexible printed circuit. FFC is an abbreviation of flexible flat cable. COF is an abbreviation for chip on film. The drive signal and a reference voltage that drive the piezoelectric elements 34 are fed from the wiring substrate 51 to each of the piezoelectric elements 34. One or more of Au, Pt, Al, Cu, Ni, Cr, Ti, and the like can be used for the metal constituting the lead wire. The lead wire may include an adhesion layer such as nichrome abbreviated as NiCr.

The liquid LQ that has flowed out from the liquid container CT flows to the feed ports 36a, the liquid storage chambers RS, the relay liquid chambers 31c, the individual feed holes 31a, the individual pressure chambers C1, the individual communication holes 31b, and the individual nozzles NZ in the above order. When the piezoelectric elements 34 contract the pressure chambers C1 to discharge the droplets DR, the droplets DR are discharged through the nozzles NZ in the −Z direction.

As illustrated in FIG. 18, in a case in which the diaphragm wall surface FW0 is flat during the drive voltage non-application period, when the diaphragm 33 is bent towards the pressure chamber C1 to discharge a liquid, the diaphragm wall surface FW0 is stretched. In other words, a difference between an area of each diaphragm wall surface FW0 during a liquid non-discharging period and an area of the diaphragm wall surface FW0 during a liquid discharging period is large. With the above, the region AC1a in the pressure chamber corresponding portion AC1 of the diaphragm 33, which is near the pressure chamber non-corresponding portion AC0, is in a state allowing cracking to occur easily. Furthermore, the pressure of the liquid inside each pressure chamber C1 increases due to the corresponding bent wall surface FW0, and pushing force towards the corresponding piezoelectric element 34 is applied to the region AC1a near the corresponding pressure chamber non-corresponding portion AC0. Due to the above, when the region AC1a described above becomes deformed greatly, cracking occurs in the region AC1a described above.

Accordingly, in the present specific example, the diaphragm wall surface FW0 is shaped so that the second portion P2 that is relatively near the first partitioning wall WL1 bulges towards the pressure chamber C1 with respect to the first portion P1 that is relatively far from the first partitioning wall WL1 to suppress cracking from occurring in the diaphragm 33. Hereinafter, referring to FIGS. 4, 5, and other drawings, an example of a structure of the liquid discharging head 10 will be described.

As illustrated in FIGS. 4 and 5, in a section orthogonal to the X-axis, the liquid discharging head 10 includes, in order in the +Z direction, the pressure chamber substrate body portion 32a that is an example of the pressure chamber partitioning portion, the diaphragm 33, and the piezoelectric elements 34 including the piezoelectric substances 34b. The pressure chamber substrate body portion 32a includes the plurality of partitioning walls WL0 that partition the pressure chambers C1 in which pressure to discharge the liquid LQ is applied to the liquid LQ. The diaphragm 33 includes wall surfaces FW0 that face the pressure chambers C1. In a section orthogonal to the X-axis, the piezoelectric element 34 includes the first electrode 34a at a position that partially overlaps the pressure chamber C1, the piezoelectric substance 34b that covers the first electrode 34a, and the second electrode 34c common to the plurality of pressure chambers C1. An individual drive signal is fed to each first electrode 34a. The second electrode 34c includes, at portions between the piezoelectric substances 34b in the Y-axis direction, portions in contact with the diaphragm 33. A reference potential, which is a constant electric potential, is fed to the second electrode 34c. Accordingly, a voltage, which is a difference between the reference potential fed to the second electrode 34c and the electric potential of the drive signal fed to the first electrode 34a, is applied to the piezoelectric substance 34b. The electric potential of the drive signal corresponds to the discharging amount of the droplet DR. A ground potential may be fed to the second electrode 34c.

The wall surfaces FW0 in the diaphragm 33 that face the pressure chambers C1 include recessed portions FW1 that are recessed at portions away from the partitioning walls WL0. In other words, the diaphragm wall surfaces FW0 include protruded portions FW2 that bulge towards the pressure chambers C1 at portions adjacent to the partitioning walls WL0. Note that the two partitioning walls WL0 that interpose the pressure chamber C1 in between in the Y-axis direction are referred to as the first partitioning wall WL1 and the second partitioning wall WL2. In other words, the plurality of partitioning walls WL0 include the first partitioning wall WL1 and the second partitioning wall WL2, and the pressure chamber C1 is located between the first partitioning wall WL1 and the second partitioning wall WL2 in the Y-axis direction. Furthermore, as illustrated in FIGS. 4 and 5, each wall surface FW0 of the diaphragm 33 includes the first portion P1 at the first position L1, in which the distance D1 between the first position L1 and the first partitioning wall WL1 is equivalent to or smaller than the distance D2 between the first position L1 and the second partitioning wall WL2 in the Y-axis direction, and the second portion P2 at the second position L2 between the first position L1 and the first partitioning wall WL1 in the Y-axis direction. In the diaphragm wall surface FW0, the first portion P1 is at the recessed portion FW1, and the second portion P2 is at the protruded portion FW2. The liquid discharging head 10 is characterized in that the second portion P2 is, at a position in the +Z direction, located on the opposite side SR1 in the +Z direction with respect to the first portion P1.

In the present specific example, the +Z direction is an example of the first direction, and the X-axis direction is an example of the second direction that intersects the first direction. Accordingly, the position of the second portion P2 in the first direction is on the opposite side SR1 in the first direction with respect to the first portion P1. In the diaphragm wall surface FW0, since the second portion P2 that is relatively near the first partitioning wall WL1 bulges towards the pressure chamber C1 with respect to the first portion P1 that is relatively far from the first partitioning wall WL1, when the liquid LQ is discharged, the diaphragm 33 bent towards the pressure chamber C1 is first bent so that the area of the diaphragm wall surface FW0 becomes smaller. As a result, the difference between the area of the diaphragm wall surface FW0 during the liquid non-discharging period and the area of the diaphragm wall surface FW0 during the liquid discharging period is small when compared with when the diaphragm wall surface FW0, described using FIG. 18, is flat. FIG. 4 schematically illustrates, with a two-dot chain line, a state in which the diaphragm wall surface FW0 has been bent.

With the above, stretching of the diaphragm wall surfaces FW0 is suppressed and the region AC1a in the pressure chamber corresponding portion AC1 of the diaphragm 33, which is near the pressure chamber non-corresponding portion AC0, reaches a state that does not allow cracking to occur easily. Accordingly, cracking is suppressed from occurring in the diaphragm 33. Furthermore, since the diaphragm wall surface FW0 includes the recessed portion FW1, the amount of liquid LQ entering the pressure chamber C1 in advance increases. The liquid discharging capacity and refilling performance of the liquid discharging head are improved with the above.

Furthermore, the diaphragm wall surface FW0 includes the third portion P3 at the third position L3, which is between the first position L1 and the second partitioning wall WL2 in the Y-axis direction. The third portion P3 is at the protruded portion FW2. The position of the third portion P3 in the +Z direction is on the opposite side SR1 in the +Z direction with respect to the first portion P1. In the diaphragm wall surface FW0, since the third portion P3 that is relatively near the second partitioning wall WL2 bulges towards the pressure chamber C1 with respect to the first portion P1 that is relatively far from the second partitioning wall WL2, when the liquid LQ is discharged, the diaphragm 33 bent towards the pressure chamber C1 is first bent so that the area of the diaphragm wall surface FW0 becomes smaller. With the above, stretching of the diaphragm wall surfaces FW0 is suppressed and the region AC1a in the pressure chamber corresponding portion AC1 of the diaphragm 33, which is near the pressure chamber non-corresponding portion AC0, reaches a state that does not allow cracking to occur easily; accordingly, cracking is suppressed from occurring in the diaphragm 33.

Referring to the example illustrated in FIGS. 4 and 5, a thickness t11 of the first-elastic-layer thickness portion T11 at the first position L1 is smaller than a thickness t21 of the second-elastic-layer thickness portion T21 at the second position L2, and is smaller than a thickness t31 of the third-elastic-layer thickness portion T31 at the third position L3. In other words, the second-elastic-layer thickness portion T21 is thicker than the first-elastic-layer thickness portion T11, and the third-elastic-layer thickness portion T31 is also thicker than the first-elastic-layer thickness portion T11. Accordingly, the thickness t21 of the elastic layer 33a at the second position L2 is thicker than the thickness t11 of the elastic layer 33a at the first position L1. Furthermore, the thickness t31 of the elastic layer 33a at the third position L3 is thicker than the thickness t11 of the elastic layer 33a at the first position L1.

A position of an end portion T21a of the second-elastic-layer thickness portion T21 in the +Z direction is substantially the same as a position of the end portion T11a of the first-elastic-layer thickness portion T11 in the +Z direction. A position of an end portion T31a of the third-elastic-layer thickness portion T31 in the +Z direction is also substantially the same as the position of the end portion T11a of the first-elastic-layer thickness portion T11 in the +Z direction. Accordingly, the position of the end portion T21a of the elastic layer 33a in the +Z direction and at the second position L2 is substantially the same as the position of the end portion T11a of the elastic layer 33a in the +Z direction and at the first position L1. In other words, the end portion of the elastic layer 33a on the second side in the Z-axis direction and at the second position L2 is positioned at a position that is substantially the same as that of the end portion of the elastic layer 33a on the second side in the Z-axis direction and at the first position L1. Furthermore, the position of the end portion T31a of the elastic layer 33a in the +Z direction and at the third position L3 is substantially the same as the position of the end portion T11a of the elastic layer 33a in the +Z direction and at the first position L1. In other words, the end portion of the elastic layer 33a on the second side in the Z-axis direction and at the third position L3 is positioned at a position that is substantially the same as that of the end portion of the elastic layer 33a on the second side in the Z-axis direction and at the first position L1. In the present specific example, the end portion T11b of the first-elastic-layer thickness portion T11 on the opposite side in the +Z direction is the first portion P1 of the diaphragm wall surface FW0. The end portion T21b of the second-elastic-layer thickness portion T21 on the opposite side in the +Z direction is the second portion P2 of the diaphragm wall surface FW0. The end portion T31b of the third-elastic-layer thickness portion T31 on the opposite side in the +Z direction is the third portion P3 of the diaphragm wall surface FW0.

Meanwhile, a thickness t22 of the second-insulating-layer thickness portion T22 at the second position L2 is substantially the same as a thickness t12 of the first-insulating-layer thickness portion T12 at the first position L1. A thickness t32 of the third-insulating-layer thickness portion T32 at the third position L3 is substantially the same as the thickness t12 of the first-insulating-layer thickness portion T12 at the first position L1. Accordingly, the thickness t22 of the insulating layer 33b at the second position L2 is substantially the same as the thickness t12 of the insulating layer 33b at the first position L1. Furthermore, the thickness t32 of the insulating layer 33b at the third position L3 is substantially the same as the thickness t12 of the insulating layer 33b at the first position L1. Note that a thickness of a certain region being substantially the same as a thickness of another region denotes that the thickness ratio of the thickness of the certain region to the thickness of the another region is from 0.8 or larger to 1.2 or smaller.

A position of an end portion T22a of the second-insulating-layer thickness portion T22 in the +Z direction is substantially the same as a position of an end portion T12a of the first-insulating-layer thickness portion T12 in the +Z direction. A position of an end portion T32a of the third-insulating-layer thickness portion T32 in the +Z direction is also substantially the same as a position of the end portion T12a of the first-insulating-layer thickness portion T12 in the +Z direction. Accordingly, the position of the end portion T22a of the insulating layer 33b in the +Z direction and at the second position L2 is substantially the same as the position of the end portion T12a of the insulating layer 33b in the +Z direction and at the first position L1. In other words, the end portion of the insulating layer 33b on the second side in the Z-axis direction and at the second position L2 is positioned at a position that is substantially the same as that of the end portion of the insulating layer 33b on the second side in the Z-axis direction and at the first position L1.

Furthermore, the position of the end portion T32a of the insulating layer 33b in the +Z direction and at the third position L3 is substantially the same as the position of the end portion T12a of the insulating layer 33b in the +Z direction and at the first position L1. In other words, the end portion of the insulating layer 33b on the second side in the Z-axis direction and at the third position L3 is positioned at a position that is substantially the same as that of the end portion of the insulating layer 33b on the second side in the Z-axis direction and at the first position L1.

The position of an end portion T22b of the second-insulating-layer thickness portion T22 on the opposite side SR1 in the +Z direction is substantially the same as the position of the end portion T12b of the first-insulating-layer thickness portion T12 on the opposite side SR1 in the +Z direction. A position of an end portion T32b of the third-insulating-layer thickness portion T32 on the opposite side SR1 in the +Z direction is also substantially the same as the position of the end portion T12b of the first-insulating-layer thickness portion T12 on the opposite side SR1 in the +Z direction. Accordingly, the position of the end portion T22b of the insulating layer 33b on the opposite side SR1 in the +Z direction and at the second position L2 is substantially the same as the position of the end portion T12b of the insulating layer 33b on the opposite side SR1 in the +Z direction and at the first position L1. In other words, the end portion of the insulating layer 33b on the first side in the Z-axis direction and at the second position L2 is positioned at a position that is substantially the same as that of the end portion of the insulating layer 33b on the first side in the Z-axis direction and at the first position L1. Furthermore, the position of the end portion T32b of the insulating layer 33b on the opposite side SR1 in the +Z direction and at the third position L3 is substantially the same as the position of the end portion T12b of the insulating layer 33b on the opposite side SR1 in the +Z direction and at the first position L1. In other words, the end portion of the insulating layer 33b on the first side in the Z-axis direction and at the third position L3 is positioned at a position that is substantially the same as that of the end portion of the insulating layer 33b on the first side in the Z-axis direction and at the first position L1.

Referring to the example illustrated in FIG. 4, a thickness t1 of a first diaphragm thickness portion T1 at the first position L1 is smaller than a thickness t2 of a second diaphragm thickness portion T2 at the second position L2, and is smaller than a thickness t3 of a third diaphragm thickness portion T3 at the third position L3. In other words, the second diaphragm thickness portion T2 is thicker than the first diaphragm thickness portion T1, and the third diaphragm thickness portion T3 is also thicker than the first diaphragm thickness portion T1. Accordingly, the thickness t2 of the diaphragm 33 at the second position L2 is larger than the thickness t1 of the diaphragm 33 at the first position L1. Furthermore, the thickness t3 of the diaphragm 33 at the third position L31 is larger than the thickness t1 of the diaphragm 33 at the first position L1. At the pressure chamber corresponding portion AC1 of the diaphragm 33, the relatively thick second diaphragm thickness portion T2 increases the rigidity of the region AC1a near the pressure chamber non-corresponding portion AC0, and at the pressure chamber corresponding portion AC1 of the diaphragm 33, the relatively thick third diaphragm thickness portion T3 also increases the rigidity of the region AC1a near the pressure chamber non-corresponding portion AC0. Accordingly, cracking is effectively suppressed from occurring in the diaphragm 33.

Furthermore, as in the liquid discharging head 10 illustrated in FIGS. 6 and 7, there may be a protruded portion, which is configured to match the recessed portion FW1 of the diaphragm wall surface FW0, in the piezoelectric element disposing surface 33c. In such a case, the thickness t1 of the first diaphragm thickness portion T1 at the first position L1 is substantially the same as the thickness t2 of the second diaphragm thickness portion T2 at the second position L2, and is substantially the same as the thickness t3 of the third diaphragm thickness portion T3 at the third position L3.

Furthermore, as in the liquid discharging head 10 illustrated in FIG. 8, there may be a protruded portion, which is configured to be higher than the depth of the recessed portion FW1 of the diaphragm wall surface FW0, in the piezoelectric element disposing surface 33c.

Referring to the example illustrated in FIGS. 8 and 9, the position of the end portion T21a of the second-elastic-layer thickness portion T21 in the +Z direction is on the opposite side SR1 in the +Z direction with respect to the position of the end portion T11a of the first-elastic-layer thickness portion T11 in the +Z direction. The position of the end portion T31a of the third-elastic-layer thickness portion T31 in the +Z direction is also on the opposite side SR1 in the +Z direction with respect to the position of the end portion T11a of the first-elastic-layer thickness portion T11 in the +Z direction. Accordingly, the position of the end portion 121a of the elastic layer 33a in the +Z direction and at the second position L2 is on the opposite side SR1 in the +Z direction with respect to the position of the end portion T11a of the elastic layer 33a in the +Z direction and at the first position L1. In other words, the end portion of the elastic layer 33a on the second side in the Z-axis direction and at the second position L2 is positioned at a position that is on the first side in the Z-axis direction with respect to the end portion of the elastic layer 33a on the second side in the Z-axis direction and at the first position L1. Furthermore, the position of the end portion 131a of the elastic layer 33a in the +Z direction and at the third position L3 is on the opposite side SR1 in the +Z direction with respect to the position of the end portion T11a of the elastic layer 33a in the +Z direction and at the first position L1. In other words, the end portion of the elastic layer 33a on the second side in the Z-axis direction and at the third position L3 is positioned at a position that is on the first side in the Z-axis direction with respect to the end portion of the elastic layer 33a on the second side in the Z-axis direction and at the first position L1.

The position of the end portion T22a of the second-insulating-layer thickness portion T22 in the +Z direction is on the opposite side SR1 in the +Z direction with respect to the position of the end portion T12a of the first-insulating-layer thickness portion T12 in the +Z direction. The position of the end portion T32a of the third-insulating-layer thickness portion T32 in the +Z direction is also on the opposite side SR1 in the +Z direction with respect to the position of the end portion T12a of the first-insulating-layer thickness portion T12 in the +Z direction. Accordingly, the position of the end portion T22a of the insulating layer 33b in the +Z direction and at the second position L2 is on the opposite side SR1 in the +Z direction with respect to the position of the end portion T12a of the insulating layer 33b in the +Z direction and at the first position L1. In other words, the end portion of the insulating layer 33b on the second side in the Z-axis direction and at the second position L2 is positioned at a position that is on the first side in the Z-axis direction with respect to the end portion of the insulating layer 33b on the second side in the Z-axis direction and at the first position L1. Furthermore, the position of the end portion T32a of the insulating layer 33b in the +Z direction and at the third position L3 is also on the opposite side SR1 in the +Z direction with respect to the position of the end portion T12a of the insulating layer 33b in the +Z direction and at the first position L1. In other words, the end portion of the insulating layer 33b on the second side in the Z-axis direction and at the third position L3 is positioned at a position that is on the first side in the Z-axis direction with respect to the end portion of the insulating layer 33b on the second side in the Z-axis direction and at the first position L1.

The position of an end portion T22b of the second-insulating-layer thickness portion T22 on the opposite side SR1 in the +Z direction is on the opposite side SR1 in the +Z direction with respect to the position of the end portion T12b of the first-insulating-layer thickness portion T12 on the opposite side SR1 in the +Z direction. The position of an end portion T32b of the third-insulating-layer thickness portion T32 on the opposite side SR1 in the +Z direction is also on the opposite side SR1 in the +Z direction with respect to the position of the end portion T12b of the first-insulating-layer thickness portion T12 on the opposite side SR1 in the +Z direction. Accordingly, the position of the end portion T22b of the insulating layer 33b on the opposite side SR1 in the +Z direction and at the second position L2 is on the opposite side SR1 in the +Z direction with respect to the position of the end portion T12b of the insulating layer 33b on the opposite side SR1 in the +Z direction and at the first position L1. In other words, the end portion of the insulating layer 33b on the first side in the Z-axis direction and at the second position L2 is positioned at a position that is on the first side in the Z-axis direction with respect to the end portion of the insulating layer 33b on the first side in the Z-axis direction and at the first position L1. The position of the end portion T32b of the insulating layer 33b on the opposite side SR1 in the +Z direction and at the third position L3 is on the opposite side SR1 in the +Z direction with respect to the position of the end portion T12b of the insulating layer 33b on the opposite side SR1 in the +Z direction and at the first position L1. In other words, the end portion of the insulating layer 33b on the first side in the Z-axis direction and at the third position L3 is positioned at a position that is on the first side in the Z-axis direction with respect to the end portion of the insulating layer 33b on the first side in the Z-axis direction and at the first position L1.

Referring to the example illustrated in FIGS. 8 and 9, the thickness t1 of the first diaphragm thickness portion T1 at the first position L1 is larger than the thickness t2 of the second diaphragm thickness portion T2 at the second position L2, and is larger than the thickness t3 of the third diaphragm thickness portion T3 at the third position L3. In other words, the second diaphragm thickness portion T2 is thinner than the first diaphragm thickness portion T1, and the third diaphragm thickness portion T3 is also thinner than the first diaphragm thickness portion T1. Accordingly, the thickness t2 of the diaphragm 33 at the second position L2 is smaller than the thickness t1 of the diaphragm 33 at the first position L1. Furthermore, the thickness t3 of the diaphragm 33 at the third position L3 is smaller than the thickness t1 of the diaphragm 33 at the first position L1.

Referring to the examples illustrated in FIGS. 4 and 6, the piezoelectric substance 34b exists at the first position L1, and does not exist at the second position L2.

Referring to the example illustrated in FIG. 8, the piezoelectric substance 34b exists in both the first position L1 and the second position L2.

Referring to the examples illustrated in FIGS. 4, 6, and 8, the piezoelectric element 34 includes, in addition to the piezoelectric substance 34b, the first electrode 34a between the diaphragm 33 and the piezoelectric substance 34b in the +Z direction, and the second electrode 34c located on the opposite side of the first electrode 34a with respect to the piezoelectric substance 34b. The first electrode 34a and the second electrode 34c both exist at the first position L1 that is relatively far from the partitioning wall WL0. The second electrode 34c exists and the first electrode 34a does not exist at the second position L2 that is relatively near the first partitioning wall WL1. The second electrode 34c exists and the first electrode 34a also does not exist in the third position L3 that is relatively near the second partitioning wall WL2.

While not illustrated in the drawings, when the first electrode 34a is a common electrode and the second electrode 34c is an individual electrode, the following can be said.

The first electrode 34a and the second electrode 34c both exist at the first position L1 that is relatively far from the partitioning wall WL0. The first electrode 34a exists and the second electrode 34c does not exist at the second position L2 that is relatively near the first partitioning wall WL1. The first electrode 34a exists and the second electrode 34c also does not exist in the third position L3 that is relatively near the second partitioning wall WL2.

The first position L1 in which the first portion P1 exists may be positioned at the middle between the first partitioning wall WL1 and the second partitioning wall WL2 in the Y-axis direction. In other words, in the Y-axis direction, the distance D1 between the first position L1 to the first partitioning wall WL1 may be the same as the distance D2 between the first position L1 to the second partitioning wall WL2.

Furthermore, the second position L2 may be a position in the Y-axis direction corresponding to the edge portion of the pressure chamber C1. In such a case, the position in the Y-axis direction corresponding to the edge portion of the pressure chamber C1 denotes a position in the Y-axis direction where the pressure chambers C1 are partitioned by the first partitioning wall WL1.

Furthermore, the third position L3 may be the position in the Y-axis direction corresponding to the edge portion of the pressure chamber C1. In such a case, the position in the Y-axis direction corresponding to the edge portion of the pressure chamber C1 denotes a position in the Y-axis direction where the pressure chambers C1 are partitioned by the second partitioning wall WL2.

(4) SPECIFIC EXAMPLE OF METHOD OF MANUFACTURING LIQUID DISCHARGING HEAD

FIGS. 10 to 17 are cross-sectional views schematically illustrating a specific example of a method of manufacturing the liquid discharging head 10 illustrated in FIG. 8. For convenience sake, the positions L1, L2, and L3 are depicted in FIGS. 11 to 17, and the portions P1, P2, and P3 are depicted in FIGS. 14 to 17. Furthermore, FIGS. 11 to 17 illustrate, when compared with FIG. 10, enlarged diagrams, and a portion of a pressure chamber substrate wafer 132 in the Z-axis direction is not illustrated.

The pressure chamber substrate 32 is formed of a silicon wafer that is made of silicon single crystal. As illustrated in FIGS. 10 to 13, first, an oxide film forming step that forms the oxide film 92 on the surface 132a of the pressure chamber substrate wafer 132, which is a silicon wafer, is performed. The oxide film 92 is formed so as to exist on the surface 132a of the pressure chamber substrate wafer 132 at the first position L1 in the Y-axis direction and so as to not exist at positions corresponding to the first partitioning wall WL1 and the second partitioning wall WL2. The oxide film forming step of the present specific example includes a pre-thermal oxidation step ST1 and a thermal oxide film patterning step ST2.

Figure 10:
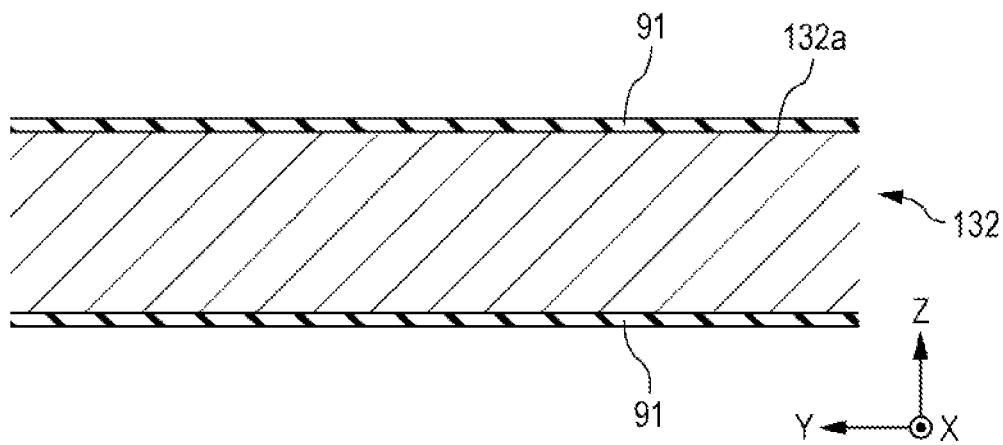
FIG. 10 is a cross-sectional view schematically illustrating an example of forming a thermal oxide film.

FIG. 10 schematically illustrates an example of forming a thermal oxide film 91 on the surface 132a of the pressure chamber substrate wafer 132. The pre-thermal oxidation step ST1 in which a SiOx thermal oxide film 91 is formed by performing thermal oxidation on the surface 132a of the pressure chamber substrate wafer 132 is performed as a first phase in the oxide film forming step. Thermal oxidation of the pressure chamber substrate wafer 132 can be performed with a diffusion furnace of about 800° C. to about 1200° C. With the above, a SiOx thermal oxide film 91 is integrally formed on the surface 132a of the pressure chamber substrate wafer 132. While the thickness of the thermal oxide film 91 is not limited to any particular thickness, the thickness can be from about 300 nm to about 1500 nm, for example.

Figure 11:
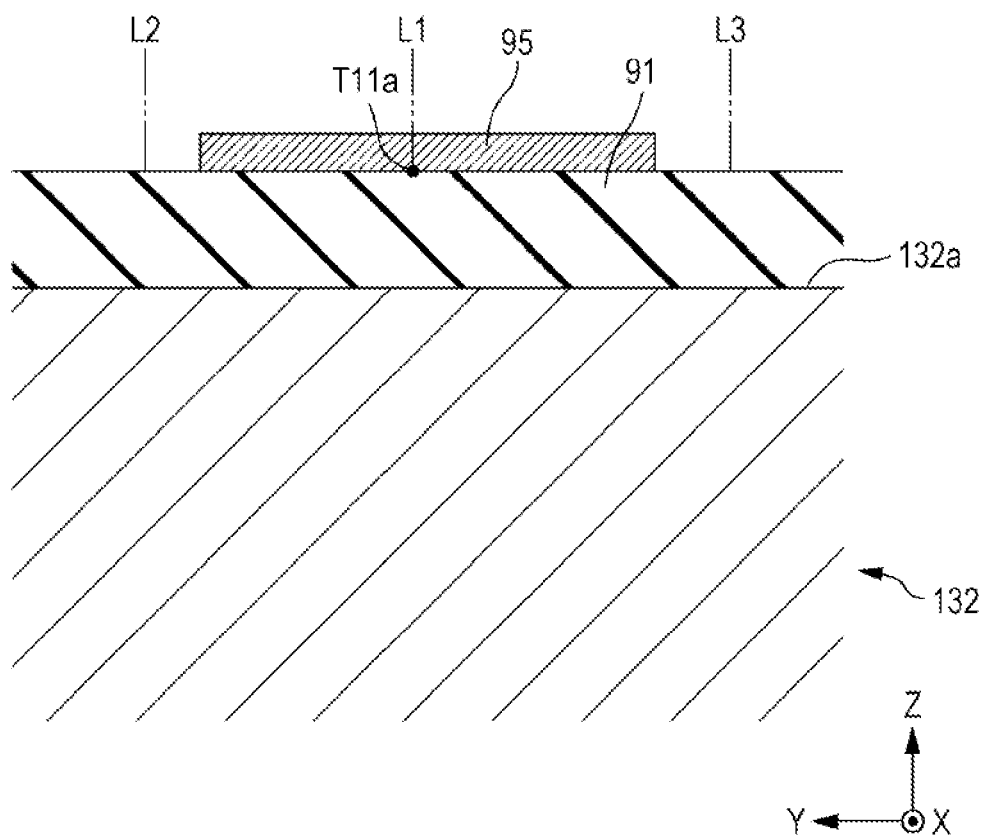
FIG. 11 is a cross-sectional view schematically illustrating an example of forming an etching mask.
Figure 12:
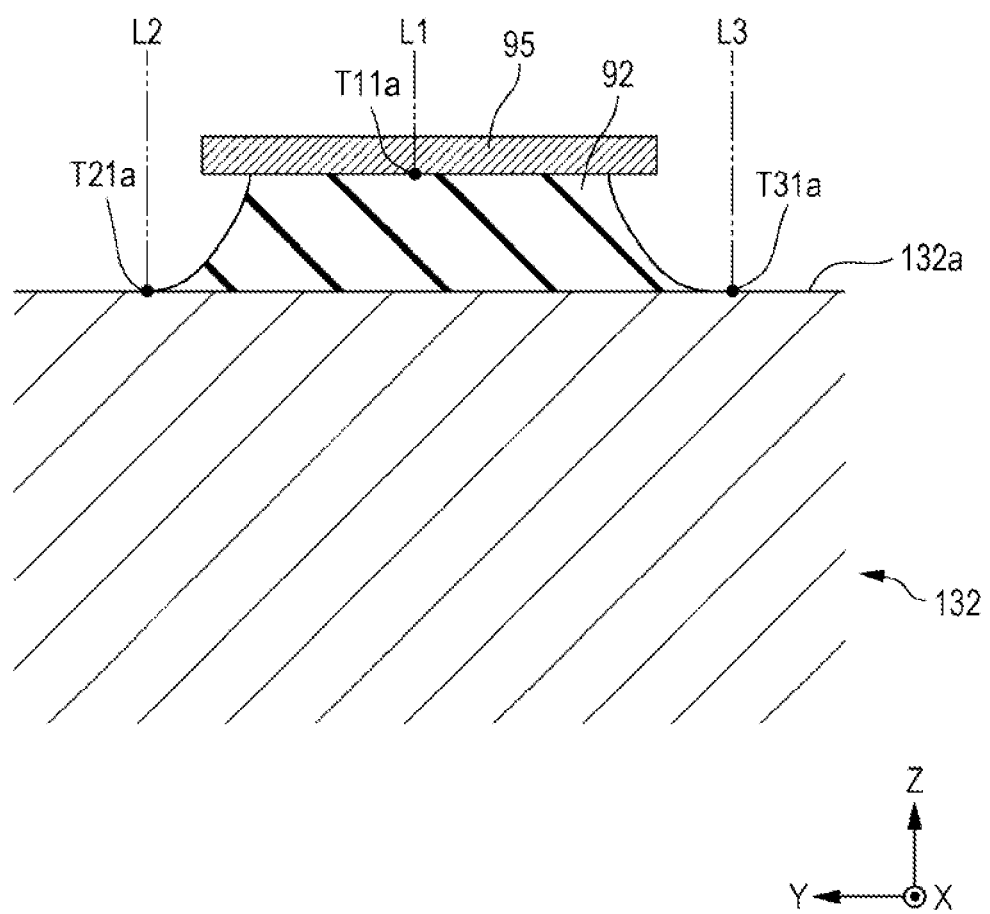
FIG. 12 is a cross-sectional view schematically illustrating an example of removing a portion of the thermal oxide film.
Figure 13:
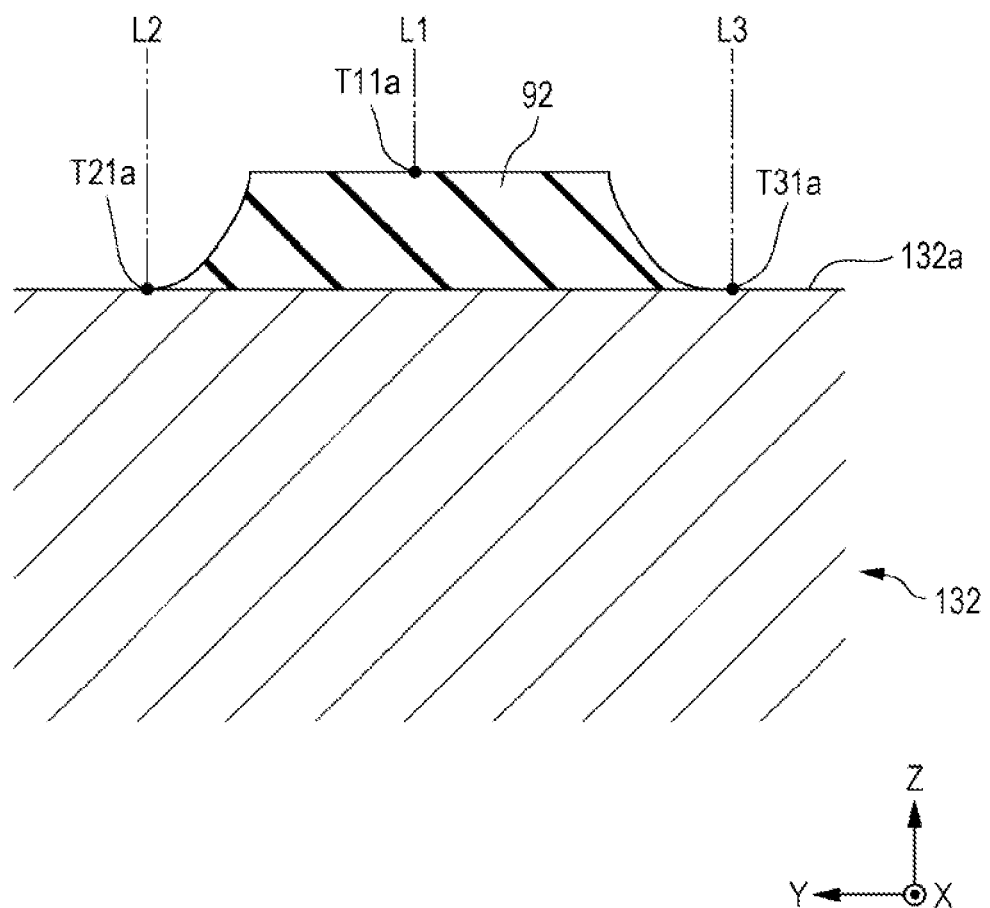
FIG. 13 is a cross-sectional view schematically illustrating an example of removing the etching mask.

After the pre-thermal oxidation step ST1, as illustrated in FIGS. 11 to 13, the thermal oxide film patterning step ST2 that forms the oxide film 92 so that the oxide film is removed from the positions in the Y-axis direction corresponding to the first partitioning wall WL1 and the second partitioning wall WL2 and is left behind at the first position L1.

As illustrated in FIG. 11, a mask forming step of forming an etching mask 95 on the thermal oxide film 91 at a position where the oxide film 92 is to be left behind is performed first. FIG. 11 illustrates the end portion T11a of the first-elastic-layer thickness portion T11 in the +Z direction.

As illustrated in FIG. 12, an etching step of removing, by etching, a portion of the thermal oxide film 91 that is not covered by the mask 95 is performed. In the etching step, silicon, for example, can be used as an etch stop layer. The etching step can be performed with an etching technique in which a high selection ratio can be obtained with silicon and SiOx. Specifically, etching techniques such as wet etching using hydrofluoric acid in which the molecular formula is HF as the etchant, dry etching using trifluoromethane gas in which the molecular formula is CHF3 or tetrafluoromethane gas in which the molecular formula is CF4 as the etchant, and other techniques can be used. Note that an etching technique that is different from the above can be used during the early state of etching. Owing to the etching step, the SiOx thermal oxide film 91 is partially left behind as the oxide film 92. FIG. 12 illustrates the end portion T21a of the second-elastic-layer thickness portion T21 in the +Z direction, and the end portion T31a of the third-elastic-layer thickness portion T31 in the +Z direction.

As illustrated in FIG. 13, lastly, a mask removing step that removes the mask 95 from the oxide film 92 is performed.

With the above, the oxide film 92 is formed so that the oxide film is removed from the positions in the Y-axis direction corresponding to the first partitioning wall WL1 and the second partitioning wall WL2 and is left behind at the first position L1.

Figure 14:
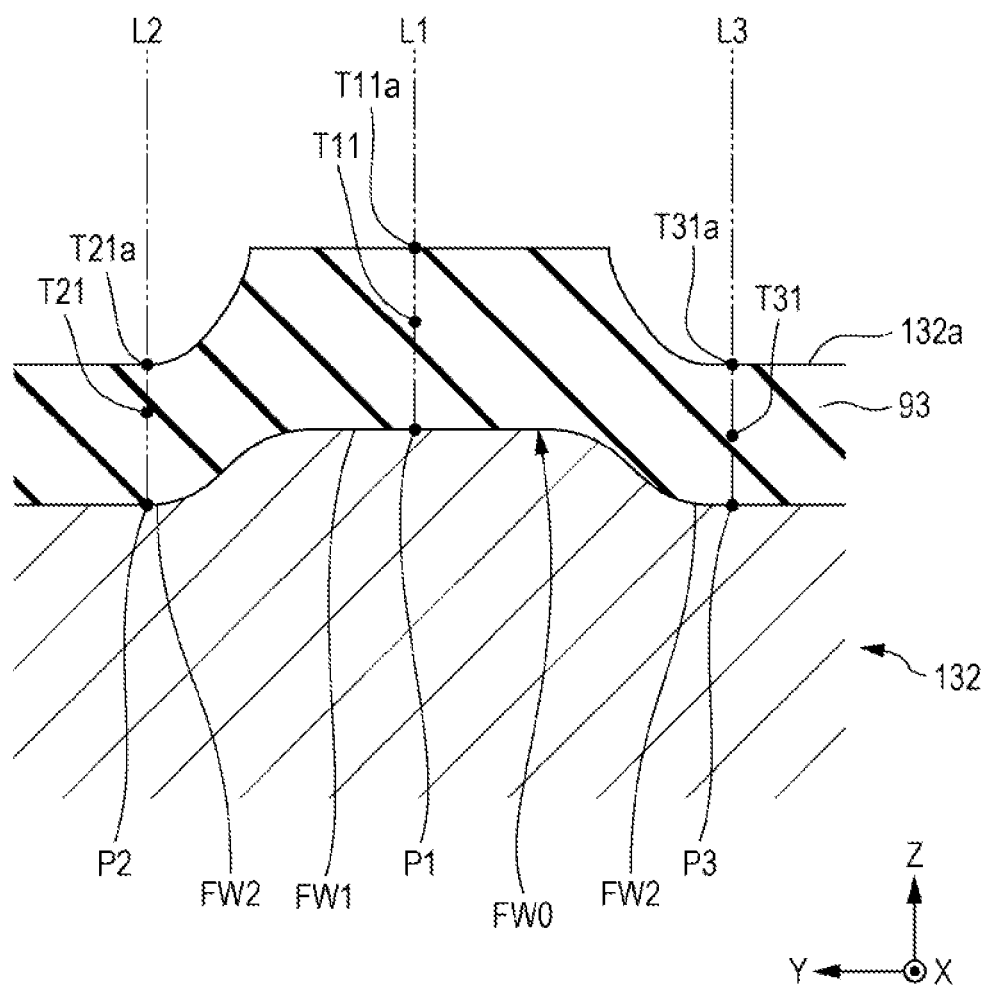
FIG. 14 is a cross-sectional view schematically illustrating an example of forming a thermal oxide layer.

Subsequently, as illustrated in FIG. 14, the thermal oxidation step ST3 in which the SiOx thermal oxide layer 93 is formed by performing thermal oxidation on the surface 132a of the pressure chamber substrate wafer 132 on which the oxide film 92 has been formed is performed. In so doing, the diffusion of oxygen during thermal oxidation is slow at the portion of the surface 132a where the oxide film 92 is present; accordingly, the recessed portion FW1 serving as the diaphragm wall surface FW0 is formed in the thermal oxide layer 93. In other words, the diffusion of oxygen during thermal oxidation is fast at the portion of the surface 132a where there is no oxide film 92; accordingly, the protruded portions FW2 serving as the diaphragm wall surfaces FW0 are formed in the thermal oxide layer 93. Accordingly, owing to the thermal oxidation in the thermal oxidation step ST3, the thermal oxide layer 93 is formed as the elastic layer 33a of the diaphragm 33 so that the second portion P2 and the third portion P3, in the +Z direction, are positioned on the opposite side SR1 in the +Z direction with respect to the first portion P1.

While the thickness of the thermal oxide layer 93 where the oxide film 92 was present is not limited to any particular thickness, the thickness can be from about 500 nm to about 2000 nm, for example. While the thickness of the thermal oxide layer 93 where the oxide film 92 was not present is not limited to any particular thickness, the thickness can be from about 300 nm to about 1500 nm, for example.

Figure 15:
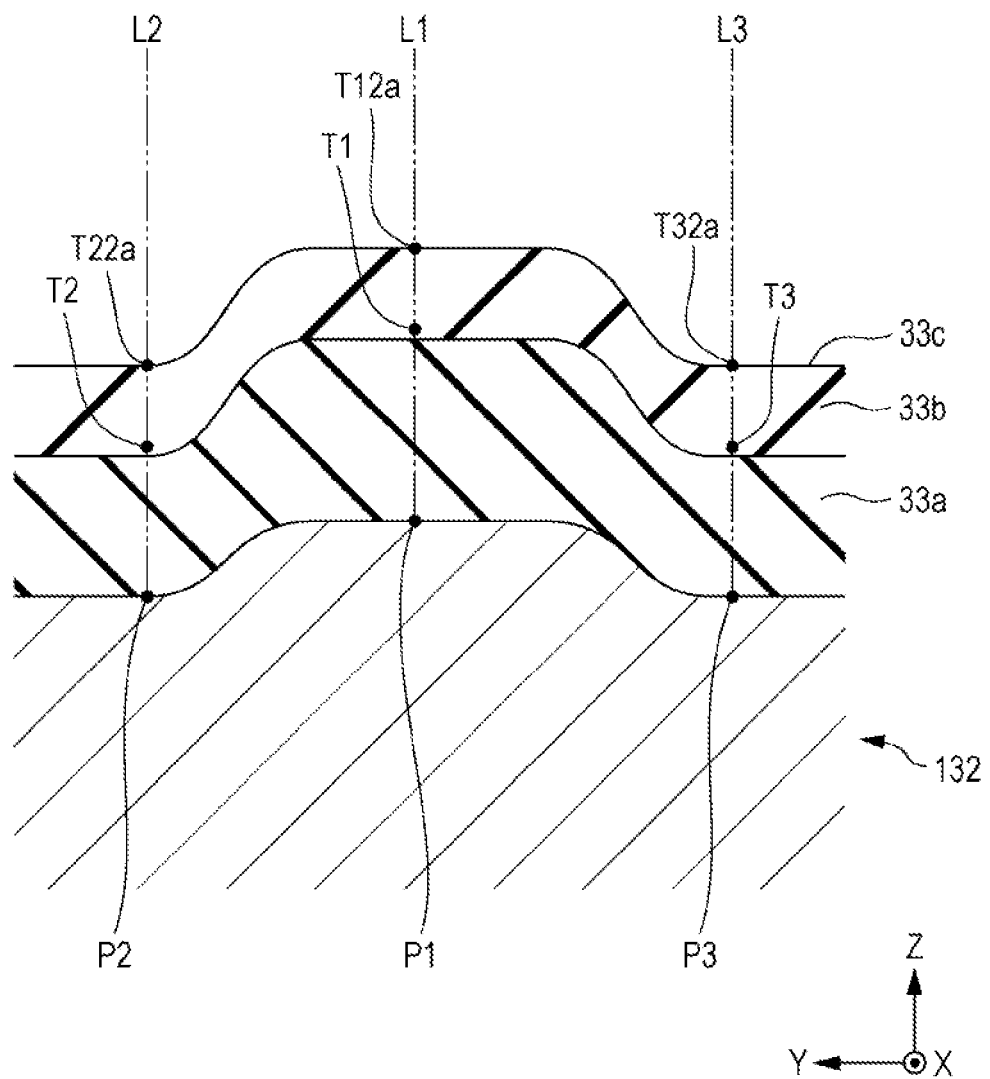
FIG. 15 is a cross-sectional view schematically illustrating an example of forming an insulating layer.

Subsequently, as illustrated in FIG. 15, an insulating layer forming step ST4 in which ZrOx is formed as the insulating layer 33b by thermal oxidation after forming a zirconium film on the pressure chamber substrate wafer 132 including the elastic layer 33a by a sputtering technique is performed. The insulating layer forming step ST4 includes a zirconium film forming step in which zirconium is formed into a film by a sputtering technique, and a zirconium film thermal oxidation step that performs thermal oxidation on the zirconium film. By performing the insulating layer forming step ST4, the diaphragm 33 in which the elastic layer 33a and the insulating layer 33b are layered on the pressure chamber substrate wafer 132 is formed. FIG. 15 illustrates a first thickness portion T1, the end portion T12a of the first-insulating-layer thickness portion T12 in the +Z direction, a second thickness portion T2, the end portion T22a of the second-insulating-layer thickness portion T22 in the +Z direction, a third thickness portion T3, and the end portion T32a of the third-insulating-layer thickness portion T32 in the +Z direction.

It goes without saying that the method with which the insulating layer 33b is formed may be a CVD method, an evaporation method, or a liquid-phase method such as a spin coating method, a combination of the above, and the like, which does not perform thermal oxidation.

Figure 16:
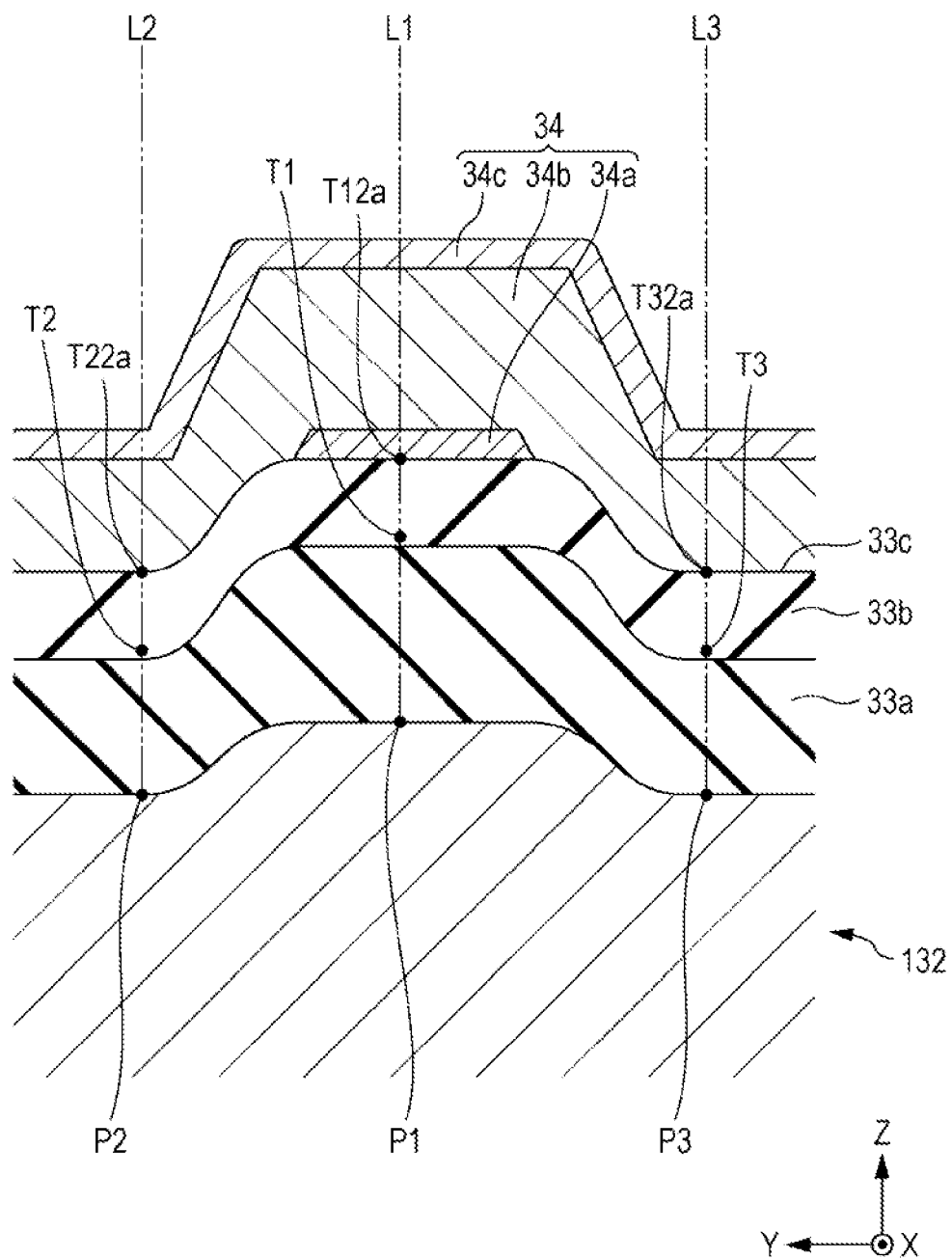
FIG. 16 is a cross-sectional view schematically illustrating an example of forming a piezoelectric element.

Subsequently, as illustrated in FIG. 16, a piezoelectric element forming step ST5 that forms piezoelectric elements 34 on the piezoelectric element disposing surface 33c of the diaphragm 33 is performed. The piezoelectric element forming step ST5 includes a first electrode forming step that forms the first electrodes 34a on the piezoelectric element disposing surface 33c, a piezoelectric substance forming step that forms the piezoelectric substances 34b on the piezoelectric element disposing surface 33c on which the first electrodes 34a have been formed, and a second electrode forming step that forms the second electrode 34c on the piezoelectric element disposing surface 33c on which the first electrodes 34a and the piezoelectric substances 34b have been formed.

The first electrodes 34a and the second electrode 34c can be formed by, for example, a film forming step that forms a film with metal such as, for example, iridium, platinum, and the like, and a metal film patterning step that performs patterning on the metal film that has been formed. Physical vapor deposition and the like such as a sputtering technique may be used to form the metal film. A lithography method or the like can be used in patterning.

The piezoelectric substance 34b before patterning can be formed by physical vapor deposition and the like such as, for example, a sol-gel method, a MOD method, a sputtering technique, and laser ablation. Note that MOD is an abbreviation for metal organic deposition. A lithography method and the like can be used for patterning the piezoelectric substance 34b.

While not depicted in the drawings, a lead wire forming step that forms lead wire coupled to the electrodes 34a and 34c is performed. The lead wire forming step includes a lead wire layering step in which the lead wire is layered on the electrodes 34a and 34c, and a wiring patterning step. The lead wire can be formed by forming a film with metal such as, for example, gold and the like. Physical vapor deposition and the like such as a sputtering technique may be used to form the metal film. A lithography method or the like can be used in patterning.

Subsequently, a protective substrate bonding step, illustrated in FIG. 3, that bonds the protective substrate 35 to the insulating layer 33b is performed. The protective substrate 35 including the spaces 35a and the through hole 35b can be formed from a protective substrate wafer that is, for example, a silicon wafer. A method of forming the spaces 35a and the through hole 35b in the protective substrate wafer is not limited to any particular method. For example, by performing anisotropic etching on the protective substrate wafer through a mask, the spaces 35a and the through hole 35b are formed in a highly precise manner. An alkaline solution such as a potassium hydroxide solution can be used as the etchant. It goes without saying that dry etching such as plasma etching can be used instead of wet etching to form the spaces 35a and the through hole 35b. The protective substrate 35 is, for example, adhered to the insulating layer 33b with an adhesive agent.

Figure 17:
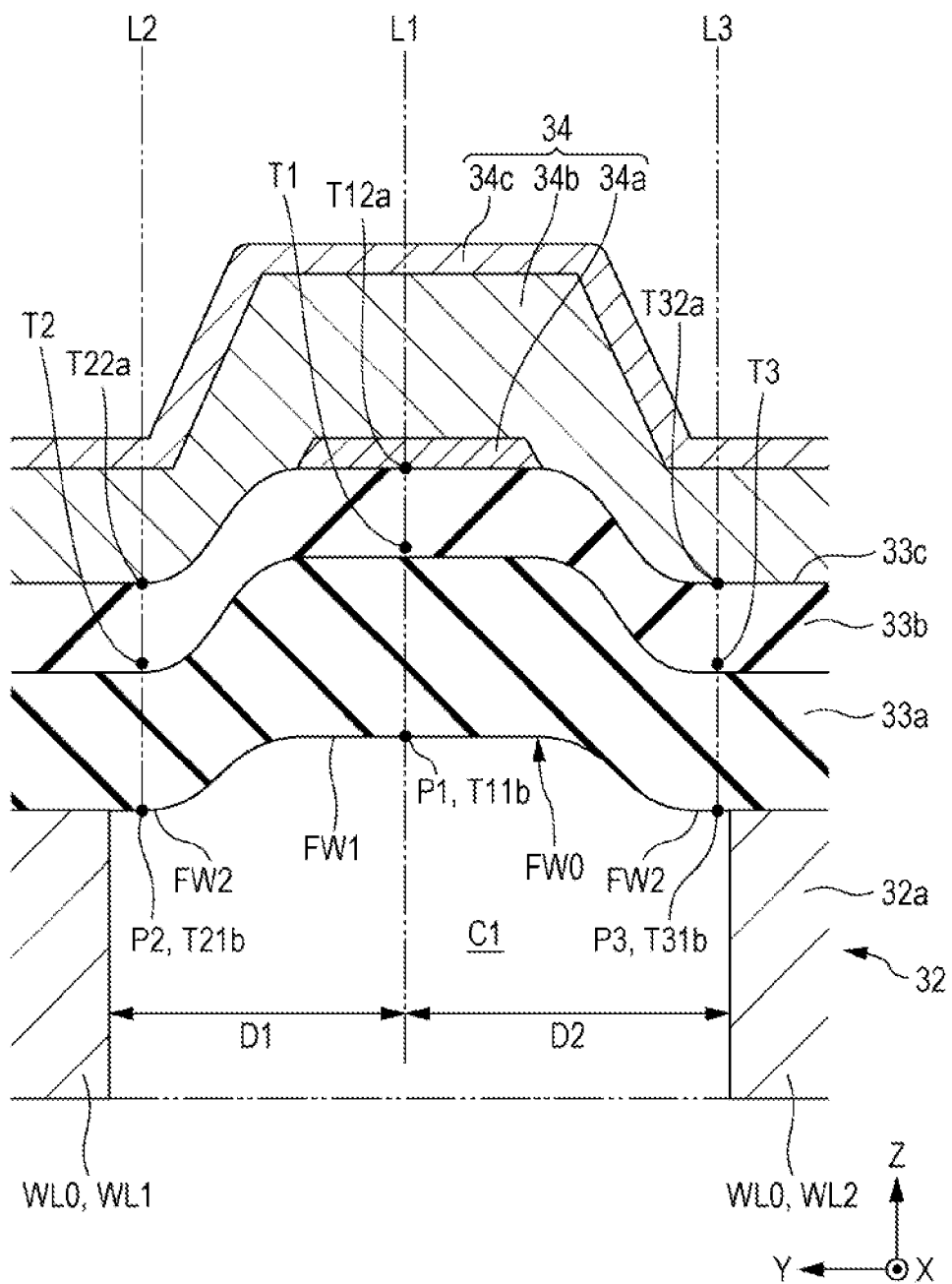
FIG. 17 is a cross-sectional view schematically illustrating an example of forming a pressure chamber.

Subsequently, as illustrated in FIG. 17, a pressure chamber substrate forming step in which the pressure chambers C1 are formed while the elastic layer 33a is left behind from the pressure chamber substrate wafer 132 on which the diaphragm 33 including the elastic layer 33a serving as the thermal oxide layer 93 is formed is performed. The pressure chamber substrate forming step includes a thinning step of thinning the pressure chamber substrate wafer 132 from the side opposite the protective substrate 35 to a predetermined thickness, the pressure chamber forming step ST6 that forms the pressure chambers C1 in the thinned pressure chamber substrate wafer 132, and a dividing step of dividing the pressure chamber substrate 32 and the protective substrate 35 into a size of a chip. The pressure chamber substrate wafer 132 can be thinned by one or more types of method selected from grinding, dry etching such as plasma etching, wet etching, CMP, and the like. Note that CMP is an abbreviation for chemical mechanical polishing. The method with which the pressure chamber C1 is formed in the pressure chamber substrate wafer 132 is not limited to any particular method. For example, the pressure chamber C1 is formed in a highly precise manner by performing anisotropic etching on the pressure chamber substrate wafer 132 from the side opposite the protective substrate 35 while having a mask in between. An alkaline solution such as a potassium hydroxide solution can be used as the etchant. It goes without saying that dry etching such as plasma etching can be used instead of wet etching to form the pressure chamber C1. Unnecessary portions in the pressure chamber substrate 32 and the protective substrate 35 are removed in the dividing step.

Subsequently, a communication substrate bonding step in which the communication substrate 31 that includes a liquid flow path including the feed holes 31a, the communication holes 31b, and the relay liquid chambers 31c is bonded to the pressure chamber substrate 32 is performed. The communication substrate 31 can be formed from a communication substrate wafer that is, for example, a silicon wafer. A method of forming the liquid flow path in the communication substrate wafer is not limited in particular to any method. For example, the relay liquid chambers 31c are formed by etching the communication substrate wafer with a first mask in between, and the feed holes 31a and the communication holes 31b are formed by etching the communication substrate wafer with a second mask in between. The etching may be wet etching or may be dry etching. The communication substrate 31 is adhered to the pressure chamber substrate body portion 32a with an adhesive agent, for example. Alternatively, the pressure chamber substrate 32 and the communication substrate 31 can be bonded by room-temperature activated bonding, plasma activated bonding, and the like.

Subsequently, a nozzle substrate bonding step that bonds the nozzle substrate 41 to the end surface 31f of the communication substrate 31 in the −Z direction is performed. The nozzle substrate 41 can be formed from a nozzle substrate wafer that is, for example, a silicon wafer. A method of forming the nozzles NZ in the nozzle substrate wafer is not limited to any particular method. For example, the nozzles NZ are formed by etching the nozzle substrate wafer with a mask in between. The nozzle substrate 41 is adhered to the end surface 31f of the communication substrate 31 with an adhesive agent, for example.

Subsequently, a compliance substrate bonding step that bonds the compliance substrate 42 to the end surface 31f of the communication substrate 31 in the −Z direction is performed. The compliance substrate 42 is adhered to the end surface 31f of the communication substrate 31 with an adhesive agent, for example.

Furthermore, a housing member bonding step that bonds the housing member 36 to the end surface 31h of the communication substrate 31 in the +Z direction is performed. The housing member 36 is adhered to the end surface 31f of the communication substrate 31 with an adhesive agent, for example.

Furthermore, a wiring substrate coupling step that couples the wiring substrate 51 to the lead wire is performed.

The liquid discharging head 10 illustrated in FIGS. 3 and 7 is manufactured with the above. As illustrated in FIG. 1, the manufactured liquid discharging head 10 is, together with the feeding portion 14 that feeds the liquid LQ, the transport portion 22 that transports the medium MD, and the control portion 20, used to manufacture the liquid discharging apparatus 100. Accordingly, a specific example of the method of manufacturing the liquid discharging apparatus 100 is illustrated as well.

Note that the manufacturing method described above can be appropriately changed, such as changing the order of the steps. For example, the wiring substrate coupling step may be performed before the housing member bonding step.

Owing to the manufacturing method described above, in the diaphragm wall surface FW0, the second portion P2 that is relatively near the first partitioning wall WL1 and the third portion P3 that is relatively near the second partitioning wall WL2 are shaped so as to bulge towards the pressure chamber C1 with respect to the first portion P1 that is relatively far from the first partitioning wall WL1. With the above, the region AC1a in the pressure chamber corresponding portion AC1 of the diaphragm 33, which is near the pressure chamber non-corresponding portion AC0, is in a state that does not allow cracking to occur easily. Accordingly, the manufacturing method in the present specific example can provide a suitable example in manufacturing the liquid discharging head 10, which is capable of suppressing cracking from occurring in the diaphragm 33, and the liquid discharging apparatus 100.

Note that when manufacturing the liquid discharging head 10 illustrated in FIG. 6, it is only sufficient to add, after the thermal oxidation step ST3 illustrated in FIG. 14, a step of removing the portion where the oxide film 92 was present on the surface of the thermal oxide layer 93 so that the thickness of the thermal oxide layer 93 becomes uniform. When manufacturing the liquid discharging head 10 illustrated in FIG. 4, it is only sufficient to add, after the thermal oxidation step ST3 illustrated in FIG. 14, a step performing removing until the surface of the thermal oxide layer 93 becomes flat. The step of removing the surface of the thermal oxide layer 93 can be performed by, for example, one or more types of method selected from grinding, dry etching such as plasma etching, wet etching, and the like.

(5) MODIFICATION

The printer serving as the liquid discharging apparatus includes, other than a printing dedicated machine, a multifunction machine, a facsimile machine, a multifunction machine, and the like. It goes without saying that the liquid discharging apparatus is not limited to a printer.

The liquid discharged from a fluid discharging head includes fluid such as a solution in which a solute such as dye has been melted in a solvent, sol in which solid particles such as pigment or metal particles have been dispersed in a dispersion medium, and the like. Such a liquid includes ink, liquid crystal, a conductive material, bio organic solution, and the like. The liquid discharging apparatus includes an apparatus that manufactures color filters for liquid crystal displays and the like, an apparatus that manufactures electrodes for organic EL displays and the like, a biochip manufacturing apparatus, a manufacturing apparatus that forms wiring of a wiring substrate, and other apparatuses. Note that organic EL is an abbreviation for organic electroluminescence.

In the examples described above, the second electrode 34c is an electrode common to the plurality of nozzles NZ; however, the present technique can be applied when the second electrode is an individual electrode. In the above, the first electrode may be the electrode common to the plurality of nozzles, or the piezoelectric substance may be a layer common to the plurality of nozzles.

(6) CONCLUSION

As described above, the present disclosure is capable of providing, through various aspects, a technique pertaining to a liquid discharging head configured to suppress cracking from occurring in a diaphragm, a liquid discharging apparatus, and the like. It goes without saying that even through the technique configured of the constituent elements related to the independent claims can obtain the basic action and effect described above.

Furthermore, a configuration in which the configurations disclosed in the examples described above are replaced with each other or in which the combination of the configurations are changed, a configuration in which known techniques and the configurations disclosed in the examples described above are replaced with each other or in which the combination thereof are changed, and other configurations can be embodied. The present disclosure includes such configurations as well.

What is claimed is:

1. Liquid discharging head comprising:
    a pressure chamber partitioning portion that includes a plurality of partitioning walls that partition a pressure chamber in which a pressure to discharge a liquid is applied to the liquid from another pressure chamber;
    a diaphragm that includes a wall surface that faces the pressure chamber; and
    a piezoelectric substance, the pressure chamber partitioning portion, the diaphragm, and the piezoelectric substance being provided in order in a first direction, wherein
    the plurality of partitioning walls include a first partitioning wall and a second partitioning wall,
    the pressure chamber is located between the first partitioning wall and the second partitioning wall in a second direction that intersects the first direction,
    the wall surface of the diaphragm includes a first portion at a first position, in which a distance between the first position and the first partitioning wall in the second direction is equivalent to or smaller than a distance between the first position and the second partitioning wall in the second direction, and
    the wall surface of the diaphragm includes a second portion at a second position between the first position and the first partitioning wall in the second direction, and
    the second portion, the first portion, and a side of the diaphragm opposite from the wall surface and the pressure chamber at the second position, are disposed in this order in the first direction,
    wherein, in the first direction, a portion of the side of the diaphragm opposite from the first portion is further from the pressure chamber than a portion of the side of the diaphragm opposite the second portion.

2. The liquid discharging head according to claim 1, wherein
    when a thickness is a length in the first direction,
    a thickness of the diaphragm at the second position is smaller than a thickness of the diaphragm at the first position.

3. The liquid discharging head according to claim 1, wherein
    the diaphragm includes, in order in the first direction, an elastic layer and an insulating layer,
    when a thickness is a length in the first direction,
    a thickness of the elastic layer at the second position is larger than a thickness of the elastic layer at the first position.

4. The liquid discharging head according to claim 3, wherein
    a thickness of the insulating layer at the second position is substantially same as a thickness of the insulating layer at the first position.

5. The liquid discharging head according to claim 3, wherein
    a position of an end portion of the elastic layer in the first direction and at the second position is on an opposite side of the elastic layer in the first direction with respect to a position of an end portion of the elastic layer in the first direction and at the first position.

6. The liquid discharging head according to claim 5, wherein
    a position of an end portion of the insulating layer on a first side of the insulating layer in the first direction and at the second position is on the opposite side of the insulating layer in the first direction with respect to a position of an end portion of the insulating layer on a second side of the insulating layer in the first direction and at the first position, and
    a position of an end portion of the insulating layer on the second side of the insulating layer opposite side in the first direction and at the second position is on the opposite side of the insulating layer in the first direction with respect to a position of an end portion of the insulating layer on the on the first side of the insulating layer opposite side in the first direction and at the first position.

7. The liquid discharging head according to claim 3, wherein
    a main component of the elastic layer is silicon oxide, and a main component of the insulating layer is zirconium oxide.

8. The liquid discharging head according to claim 1, wherein
    the piezoelectric substance exists at the first position and does not exist at the second position.

9. The liquid discharging head according to claim 1, further comprising:
    a first electrode located between the diaphragm and the piezoelectric substance in the first direction; and
    a second electrode that is on a side opposite the first electrode with respect to the piezoelectric substance, wherein
    the first electrode and the second electrode exist at the first position, and either one of the first electrode and the second electrode does not exist at the second position.

10. The liquid discharging head according to claim 1, wherein
    the first position is positioned at a middle between the first partitioning wall and the second partitioning wall in the second direction, and the second position is a position corresponding to an edge portion of the pressure chamber in the second direction.

11. The liquid discharging head according to claim 10, wherein the wall surface of the diaphragm further includes a third portion at a third position between the first position and the second partitioning wall in the second direction, and a position of the third portion in the first direction is on the opposite side in the first direction with respect to the first portion.

12. A liquid discharging apparatus comprising:
a liquid discharging head according to claim 1; and
a control portion that controls an operation of discharging the liquid from the liquid discharging head.

13. The liquid discharging head according to claim 1, wherein the diaphragm includes, in order in the first direction, an elastic layer and an insulating layer, the second portion, the first portion, and an interface between the elastic layer and the insulating layer at the second position, are disposed in this order in the first direction.

\* \* \* \* \*